(12) United States Patent  
Kuraguchi

(10) Patent No.: US 8,698,198 B2  
(45) Date of Patent: Apr. 15, 2014

(54) NITRIDE SEMICONDUCTOR DEVICE

(75) Inventor: Masahiko Kuraguchi, Himeji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 997 days.

(21) Appl. No.: 11/870,836

(22) Filed: Oct. 11, 2007

(65) Prior Publication Data

US 2008/0093626 A1  Apr. 24, 2008

(30) Foreign Application Priority Data

Oct. 20, 2006 (JP) .................. 2006-286332

(51) Int. Cl.
*H01L 21/02* (2006.01)

(52) U.S. Cl.
USPC ............ 257/190; 257/192; 257/E29.252

(58) Field of Classification Search
USPC ............ 257/190, 194, E29.252, 192
See application file for complete search history.

(56) References Cited

U.S. PATENT DOCUMENTS

| | | | | |
|---|---|---|---|---|
| 2002/0139995 | A1* | 10/2002 | Inoue et al. | 257/194 |
| 2002/0167023 | A1* | 11/2002 | Chavarkar et al. | 257/194 |
| 2004/0185643 | A1* | 9/2004 | Chiyo et al. | 438/518 |
| 2005/0077538 | A1* | 4/2005 | Heikman | 257/183 |
| 2006/0054925 | A1* | 3/2006 | Kikkawa | 257/192 |
| 2006/0108606 | A1* | 5/2006 | Saxler et al. | 257/200 |
| 2006/0118822 | A1* | 6/2006 | Murata et al. | 257/192 |
| 2006/0124962 | A1* | 6/2006 | Ueda et al. | 257/192 |
| 2006/0163594 | A1* | 7/2006 | Kuzmik | 257/94 |
| 2006/0214188 | A1* | 9/2006 | Kawasaki et al. | 257/194 |
| 2007/0045670 | A1 | 3/2007 | Kuraguchi | |
| 2007/0235775 | A1* | 10/2007 | Wu et al. | 257/288 |

FOREIGN PATENT DOCUMENTS

| | | |
|---|---|---|
| JP | 2004-22774 | 1/2004 |
| JP | 2006-32650 | 2/2006 |

OTHER PUBLICATIONS

Satoshi Nakazawa et al., "Recessed-Gate AlGaN/GaN HFETs With Lattice-Matched InAlGaN Quatemary Alloy Capping Layers", IEEE Transactions on Electron Devices, vol. 52, No. 10, Oct. 2005, 5 pages.

* cited by examiner

*Primary Examiner* — Cuong Q Nguyen
*Assistant Examiner* — Yosef Gebreyesus
(74) *Attorney, Agent, or Firm* — Oblon, Spivak, McClelland, Maier & Neustadt, L.L.P.

(57) ABSTRACT

A nitride semiconductor device includes: a first nitride semiconductor layer formed of non-doped $Al_XGa_{1-X}N$ ($0 \leq X<1$); a second nitride semiconductor layer formed on the first nitride semiconductor layer of non-doped or n-type $Al_YGa_{1-Y}N$ ($0<Y \leq 1$, $X<Y$), and having a smaller lattice constant than that of the first nitride semiconductor layer; a third nitride semiconductor layer formed on the second nitride semiconductor layer of a non-doped or n-type nitride semiconductor, and having a lattice constant equal to that of the first nitride semiconductor layer; a fourth nitride semiconductor layer formed on the third nitride semiconductor layer of $In_WAl_ZGa_{1-W-Z}N$ ($0<W \leq 1$, $0<Z<1$); a gate electrode formed in a recess structure having a bottom face which arrives at the third nitride semiconductor layer; and a source electrode and a drain electrode.

8 Claims, 17 Drawing Sheets

NITRIDE SEMICONDUCTOR DEVICE

CROSS-REFERENCE TO RELATED APPLICATION

This application is based upon and claims the benefit of priority from prior Japanese Patent Application No. 2006-286332 filed on Oct. 20, 2006 in Japan, the entire contents of which are incorporated herein by reference.

BACKGROUND OF THE INVENTION

1. Field of the Invention

The present invention relates to a nitride semiconductor device.

2. Related Art

In a power semiconductor device such as a switching element or a high frequency power semiconductor device, it is effective to use a material having a high critical electric field and consequently a nitride semiconductor material having high critical electric field strength is used.

As for a conventional nitride semiconductor device using a nitride semiconductor material, a first reference art is known. According to the first reference art, a carrier transit layer formed of an $Al_XGa_{1-X}N$ ($0 \leq X < 1$) film and a barrier layer formed of an $Al_YGa_{1-Y}N$ ($0 < Y \leq 1$, $X < Y$) film are stacked in order, a gate electrode is formed near a central part on the surface of the barrier layer having a uniform thickness, and a source electrode and a drain electrode are formed in substantially symmetric positions with the gate electrode between.

The AlN film is smaller in lattice constant than the GaN film. When the Al composition ratio of the barrier layer is greater than the Al composition ratio of the carrier transit layer, therefore, the lattice constant of the barrier layer becomes smaller than the lattice constant of the carrier transit layer and a strain is caused in the barrier layer. In the nitride semiconductor, polarization charges are generated in the barrier layer by piezo polarization and spontaneous polarization resulting from the strain in the barrier layer. And two-dimensional electron gas is formed at an interface between the carrier transit layer and the barrier layer by the polarization charges generated at this time.

For example, when a GaN film having Al composition ratio $X=0$ is used for the carrier transit layer and an $Al_YGa_{1-Y}N$ film is used for the barrier layer, a carrier density $n_S$ of the two-dimensional electron system is given by the following equation (1) with respect to a film thickness $d_1$ [Å] (see, for example, J. R Ibbetson et al., "Polarization effects, surface states, and the source of electrons in AlGaN/GaN heterostructure field effect transistors," Applied Physics Letters, 10 Jul. 2000, Vol. 77, No. 2, PP. 250-252).

$$n_S = \sigma_{PZ} \times (1 - T_C/d_1)[\text{cm}^{-2}] \quad (1)$$

Here, $\sigma_{PZ}$ is a charge density of polarization charges generated in the barrier layer, and $d_1$ is a film thickness of the barrier layer under the gate electrode. $T_C$ is a critical film thickness of the barrier layer at which carriers are generated. This critical film thickness $T_C$ is given by the following equation (2), and has dependence upon Al composition ratio.

$$T_C = 16.4 \times (1 - 1.27 \times Y)/Y [\text{Å}] \quad (2)$$

Furthermore, a second reference art is known. According to the second reference art, a recess structure is formed by removing a part of the barrier layer in order to reduce the contact resistance in the source electrode/drain electrode in the nitride semiconductor device or the gallium arsenide semiconductor device (see, for example, JP-A 2001-274375 (KOKAI), and JP-A 2004-22774 (KOKAI)). A hetero junction field effect transistor (hereafter referred to as HJFET) described in JP-A No. 2001-274375 has a structure obtained by stacking an undoped nitride aluminum (AlN) buffer layer, an undoped GaN channel layer, an n-type AlGaN electron supply layer, a Si single atom layer and an n-type GaN cap layer are stacked on a sapphire substrate in order, removing the whole of the n-type GaN cap layer and the Si single atom layer and a part of the n-type AlGaN electron supply layer in a position where the gate electrode is formed, thereby forming a recess structure, forming a gate electrode in this recess structure, and forming a source electrode/drain electrode on the n-type GaN cap layer having the gate electrode between. In this nitride semiconductor device, the contact resistance of the source electrode/drain electrode is lowered by providing the GaN cap layer between the source electrode/drain electrode and the n-type barrier layer.

A HJFET described in JP-A 2004-22774 (KOKAI) has a structure obtained by stacking a buffer layer formed of a semiconductor layer, a GaN channel layer, an AlGaN electron supply layer, an n-type GaN layer and an AlGaN layer in order on a substrate of sapphire or the like, removing the whole of the AlGaN layer and the n-type GaN layer and a part of the AlGaN electron supply layer in a position where the gate electrode is formed, thereby forming a recess structure, forming a gate electrode on the AlGaN electron supply layer in this recess structure, and forming a source electrode/drain electrode on the topmost AlGaN layer having the gate electrode between. In this nitride semiconductor device, the contact resistance of the source electrode/drain electrode is lowered by providing the AlGaN layer and the n-type GaN layer between the source electrode/drain electrode and the barrier layer.

In the nitride semiconductor devices described in JP-A 2001-274375 (KOKAI), and JP-A 2004-22774 (KOKAI), the AlGaN electron supply layer corresponds to the barrier layer and the GaN channel layer underlying the AlGaN electron supply layer corresponds to the carrier transit layer. As described with reference to the first reference art, therefore, polarization charges are generated in the barrier layer and two-dimensional electron gas is formed at an interface between the carrier transit layer and the barrier layer. However, the carrier density of the two-dimensional electron system under the gate electrode in the nitride semiconductor device having a recess structure depends upon the Al composition ratio Y of the barrier layer and the thickness of the barrier layer under the gate electrode.

A third reference art using the $In_YAl_ZGa_{1-Y-Z}N$ film as the contact layer in the nitride semiconductor device is known (see, for example, "IEEE TRANSACTIONS ON ELECTRON DEVICE," Vol. 52, No. 10, October, 2005, p. 2124). According to "IEEE TRANSACTIONS ON ELECTRON DEVICE," Vol. 52, No. 10, October, 2005, p. 2124, a contact layer having a thick film thickness can be formed because the $In_YAl_ZGa_{1-Y-Z}N$ film makes lattice matching to a GaN film when the relation $Z=4.66 \times Y$ is satisfied. According to "IEEE TRANSACTIONS ON ELECTRON DEVICE," Vol. 52, No. 10, October, 2005, p. 2124, favorable ohmic contact can be formed because polarization possessed by the contact layer and polarization possessed by the barrier layer cancel each other at an interface between the contact layer and the barrier layer and consequently depletion at the interface between the contact layer and the barrier layer can be prevented, by setting Y so as to generate polarization greater than the AlGaN layer when the relation $Z=4.66 \times Y$ is satisfied.

A nitride semiconductor device having a configuration obtained by stacking a buffer layer formed of a GaN film and a barrier layer formed of an AlGaN film is known as a fourth reference art (see "IEEE TRANSACTIONS ON ELECTRONICS," Vol. E82-C, No. 11, November, 1999, p. 1895). In the fourth reference art, the barrier layer is smaller in lattice constant than the buffer layer, and consequently strain is caused in the barrier layer. In the nitride semiconductor, two-dimensional electron gas is formed at the interface between the buffer layer and the barrier layer by a piezo effect caused by the strain in the barrier layer. Therefore, the nitride semiconductor device according to the fourth reference art can be made to operate as a field effect transistor by forming a source electrode, a drain electrode and a gate electrode on the barrier layer.

A nitride semiconductor device having a configuration obtained by stacking a buffer layer formed of a GaN film, a first barrier layer formed of an AlGaN film, a channel layer formed of a GaN film and a second barrier layer formed of an AlGaN film is known as a fifth reference art (see JP-A 2001-196575 (KOKAI)). In the fifth reference art, residual carriers in the buffer layer are prevented from influencing the channel layer by the first barrier layer. By forming a source electrode, a drain electrode and a gate electrode on the second barrier layer, therefore, the nitride semiconductor device according to the fifth reference art can be made to operate as a field effect transistor with the influence of the residual carriers in the buffer layer excluded as compared with the nitride semiconductor device according to the fourth reference art.

If in the nitride semiconductor device according to the fifth reference art a buffer layer formed of a GaN film, a first barrier layer formed of an InAlGaN film, a channel layer formed of a GaN film and a second barrier layer formed of an AlGaN film are stacked and the In composition ratio in the first barrier layer is in the range of 0.3 to 0.7, then the density of electrons stored in the channel layer can be increased by the spontaneous polarization and piezo polarization caused in the first barrier layer.

In the case of the nitride semiconductor device in which the gate electrode and the source electrode/drain electrode are formed on barrier layers having the same thickness as in the first reference art, a two-dimensional electron system having uniform carrier densities is formed at the interface between the carrier transit layer and the barrier layer when the film thickness of the barrier layer is equal to or greater than the critical film thickness $T_C$ indicated by the equation (2). Therefore, a two-dimensional electron system is formed at the interface between the carrier transit layer and the barrier layer, located between the source electrode and the gate electrode and between the drain electrode and the gate electrode as well. As a result, the on-resistance becomes low. Since a two-dimensional electron system having a finite carrier density exists under the gate electrode as well, the nitride semiconductor device becomes normally-on type.

On the other hand, when the film thickness of the barrier layer is equal to or less than the critical film thickness $T_C$ indicated by the equation (2), the carrier density of the two-dimensional electron system under the gate electrode becomes zero, resulting in a normally-off type nitride semiconductor device. However, the carrier density of the two-dimensional electron gas becomes zero at the interface between the carrier transit layer and the barrier layer, located between the gate electrode and the drain electrode and between the gate electrode and the source electrode as well besides under the gate electrode. As a result, the resistance between the drain electrode and the source electrode becomes large and the on-resistance also becomes high. In other words, as for the nitride semiconductor device according to the first reference art, it is difficult to fabricate a normally-off type nitride semiconductor device having low on-resistance with a high yield.

On the other hand, in the case of the nitride semiconductor device in which the recess structure is formed by removing a part of the barrier layer and the film thickness of the barrier layer under the gate electrode is decreased as in the second reference art, the two-dimensional electron system is formed at the interface between the carrier transit layer and the barrier layer, located between the source electrode and the gate electrode and between the drain electrode and the gate electrode and consequently the on-resistance becomes low, when the film thickness of the barrier layer between the source electrode and the gate electrode and between the drain electrode and the gate electrode is equal to or greater than the critical film thickness $T_C$. If the film thickness of the barrier layer under the gate electrode is equal to or less than the critical film thickness $T_C$, the carrier density of the two-dimensional electron system under the gate electrode becomes zero. As a result, the nitride semiconductor device according to the second reference art can be implemented as a normally-off type nitride semiconductor device.

Considering the energy difference in the conduction band between the carrier transit layer and the barrier layer required to implement the two-dimensional electron system, it is desirable that the Al composition ratio Y of the barrier layer is at least 0.2. At this time, it is necessary that the film thickness of the barrier layer is equal to or less than approximately 60 Å according to the equation (2) in order to make the carrier density under the gate electrode equal to zero. For implementing the normally-off type semiconductor device by using the recess structure, processing of forming the carrier transit layer, the barrier layer and the contact layer one after another by using an epitaxial crystal growth equipment and then removing a part of the barrier layer while exercising control so as to have a film thickness of 60 Å or less with high precision. Because of the problem of the processing precision, however, there is a problem that it is difficult to fabricate the normally-off type semiconductor device with a high yield.

It is known that use of dry etching such as the RIE method on the nitride causes introduction of etching damages due to the nitrogen vacancy into the semiconductor device. When processing the above-described recess structure, therefore, etching damage is introduced into a gate recess region and the channel mobility of the two-dimensional electron system under the gate recess is reduced, and it is difficult to fabricate a semiconductor device having low on-resistance. Especially in the case of the normally-off type, the film thickness of the barrier layer becomes as small as approximately several tens Å, and consequently the etched surface gets near carriers that travel through the interface between the carrier transit layer and the barrier layer and lowering in channel mobility becomes large.

The threshold voltage in the nitride semiconductor device according to the second reference art becomes (carrier density of the two-dimensional electron system under the gate electrode)/(gate capacitance per unit area). Denoting the dielectric constant of the barrier layer by $\in$, therefore, the threshold voltage $V_{th}$ is given by the following equation (3).

$$V_{th} = \sigma_{PZ}/\in \times (d_r - T_C) \quad (3)$$

In other words, the threshold voltage $V_{th}$ depends upon the Al composition ratio and the film thickness of the barrier layer as indicated by the equations (3) and (2). For example, even if processing is conducted with a comparatively favorable precision so as to make the variation of the film thickness of the barrier layer under the gate equal to 10 Å in etching to form the recess structure, the variation of the threshold voltage becomes as large as 0.3 V when the Al composition ratio Y of the barrier layer is 0.3. Therefore, there is also a problem that it is difficult to fabricate a nitride semiconductor device by controlling the threshold voltage with a high yield.

In the third reference art, favorable ohmic contact can be formed by using the $In_YAl_ZGa_{1-Y-Z}N$ film as the contact layer as described above. However, the third reference art has the same problem as the second reference art does. Specifically, since the structure under the gate does not change from that in the second reference art, processing of removing a part of the barrier layer 2 under the gate electrode while exercising control so as to make the film thickness of the barrier layer 2 equal to or less than the critical film thickness with high precision becomes necessary. Because of the problem of the processing precision, therefore, it is difficult to fabricate a normally-off type semiconductor device with a high yield. In the case of the normally-off type, the film thickness of the barrier layer is small in the same way as the second reference art. Since consequently the etched surface is close to carriers traveling through the interface between the carrier transit layer and the barrier layer, lowering of the channel mobility is made large by etching damage.

In the fourth and fifth reference arts, it is difficult to obtain favorable pinch-off characteristics because of causes described hereafter.

In the nitride semiconductor device according to the fourth reference art, carriers remaining in the buffer layer move to the interface between the buffer layer and the barrier layer. Even if the nitride semiconductor device is in the off-state, therefore, the leak current between the source and the drain cannot be suppressed. Therefore, it is difficult to improve the pinch-off characteristics of the nitride semiconductor device.

In the nitride semiconductor device according to the fifth reference art, polarization charges are generated in the first barrier layer as well. Therefore, two-dimensional electron gas is formed not only at the interface between the channel layer and the second barrier layer but also at the interface between the buffer layer and the first barrier layer. As a result, the pinch-off characteristics are degraded. For preventing the two-dimensional electron gas from being formed at the interface between the buffer layer and the first barrier layer, the Al composition ratio of the first barrier layer must be made small. For forming a barrier having a sufficient height, for example, for forming a barrier of 1 eV, the thickness of the first barrier layer needs to be approximately 500 nm. In general, it is difficult to stack the thick AlGaN film with a high quality because of lattice mismatching between the GaN film and the AlGaN film. Furthermore, since the Al composition ratio is low, piezo polarization generated in the first barrier layer is small and the potential in the channel layer near the second barrier layer does not change so largely. Therefore, the leak current between the source and the drain caused by residual carriers in the channel layer cannot be prevented, and it is difficult to improve the pinch-off characteristics remarkably.

In the case where an InAlGaN film having an In composition ratio in the range of 0.3 to 0.7 is used for the first barrier layer in the nitride semiconductor device according to the fifth reference art, the energy of the conduction band on the channel layer side is lowered by the polarization in the first barrier layer. Accordingly, carriers remaining in the channel layer become active. As a result, the leak between the source and the drain is caused, and consequently remarkable improvement of the pinch-off characteristics is difficult.

SUMMARY OF THE INVENTION

The present invention has been made in view of these circumstances, and an object thereof is to provide a nitride semiconductor device in which the threshold voltage can be controlled easily and the on-resistance is low, with a high yield. Another object of the present invention is to provide a nitride semiconductor device in which the pinch-off characteristics are favorable.

A nitride semiconductor device according to a first aspect of the present invention includes: a first nitride semiconductor layer formed of non-doped $Al_XGa_{1-X}N$ ($0 \leq X < 1$); a second nitride semiconductor layer formed on the first nitride semiconductor layer of non-doped or n-type $Al_YGa_{1-Y}N$ ($0 < Y \leq 1$, $X < Y$), and having a smaller lattice constant than that of the first nitride semiconductor layer; a third nitride semiconductor layer formed on the second nitride semiconductor layer of a non-doped or n-type nitride semiconductor, and having a lattice constant equal to that of the first nitride semiconductor layer; a fourth nitride semiconductor layer formed on the third nitride semiconductor layer of $In_WAl_ZGa_{1-W-Z}N$ ($0 < W \leq 1$, $0 < Z < 1$); a gate electrode formed in a recess structure having a bottom face which arrives at the third nitride semiconductor layer; and a source electrode and a drain electrode formed on the second nitride semiconductor layer, the third nitride semiconductor layer, or the fourth nitride semiconductor layer so as to sandwich the gate electrode therebetween.

A nitride semiconductor device according to a second aspect of the present invention includes: a first nitride semiconductor layer formed of GaN; a second nitride semiconductor layer formed on the first nitride semiconductor layer of $(In_TAl_{1-T})_SGa_{1-S}N$ ($0 < S \leq 1$, $0 < T \leq 1$); a third nitride semiconductor layer formed on the second nitride semiconductor layer of $(In_YAl_{1-Y})_XGa_{1-X}N$ ($0 < X \leq 1$, $0 \leq Y < 1$), an In composition ratio Y of the third nitride semiconductor layer being less than an In composition ratio T of the second nitride semiconductor layer; a fourth nitride semiconductor layer formed on the third nitride semiconductor layer of GaN or $In_PGa_QN$ ($0 < P < 1$, $0 < Q < 1$); a fifth nitride semiconductor layer formed on the fourth nitride semiconductor layer of $In_UAl_WGa_VN$ ($0 \leq U < 1$, $0 \leq V < 1$, $0 < W \leq 1$, $U+V+W=1$); a gate electrode formed on the fifth nitride semiconductor layer; and a source electrode and a drain electrode formed on the fifth nitride semiconductor layer on both sides of the gate electrode.

A nitride semiconductor device according to a third aspect of the present invention includes: a first nitride semiconductor layer formed of GaN; a second nitride semiconductor layer formed on the first nitride semiconductor layer of $(In_TAl_{1-T})_SGa_{1-S}N$ ($0 < S \leq 1$, $0 < T \leq 1$); a third nitride semiconductor layer formed on the second nitride semiconductor layer of $(In_YAl_{1-Y})_XGa_{1-X}N$ ($0 < X \leq 1$, $0 \leq Y < 1$), an In composition ratio Y of the third nitride semiconductor layer being less that an In composition ratio T of the second nitride semiconductor layer; a fourth nitride semiconductor layer formed on the third nitride semiconductor layer of GaN or $In_PGa_QN$ ($0 < P < 1$, $0 < Q < 1$); a fifth nitride semiconductor layer formed on the fourth nitride semiconductor layer of $In_UAl_WGa_VN$ ($0 \leq U < 1$, $0 \leq V < 1$, $0 < W \leq 1$, $U+V+W=1$); and an anode electrode and a cathode electrode formed on the fifth nitride semiconductor layer.

A nitride semiconductor device according to a fourth aspect of the present invention includes: a first nitride semiconductor layer formed of GaN; a second nitride semiconductor layer formed on the first nitride semiconductor layer of $(In_TAl_{1-T})_SGa_{1-S}N$ ($0 < S \leq 1$, $0 < T \leq 1$); a third nitride semiconductor layer formed on the second nitride semiconductor layer of $(In_YAl_{1-Y})_XGa_{1-X}N$ ($0 < X \leq 1$, $0 \leq Y < 1$), an In composition ratio Y of the third nitride semiconductor layer being less than an In composition ratio T of the second nitride semiconductor layer; a fourth nitride semiconductor layer formed on the third nitride semiconductor layer of GaN or In$_P$Ga$_Q$N (0<P<1, 0<Q<1); a fifth nitride semiconductor layer formed of non-doped or n-type Al$_U$Ga$_{1-U}$N (0<U≤1); a sixth nitride semiconductor layer formed on the fifth nitride semiconductor layer of non-doped or n-type nitride semiconductor; a seventh nitride semiconductor layer formed on the sixth nitride semiconductor layer of In$_V$Al$_Z$Ga$_{1-V-Z}$N (0<V≤1, 0<Z<1); a gate electrode formed in a recess structure having a bottom face which arrives at the sixth nitride semiconductor layer; and a source electrode and a drain electrode formed on the fifth nitride semiconductor layer, the sixth nitride semiconductor layer, or the seventh nitride semiconductor layer so as to sandwich the gate electrode therebetween.

DESCRIPTION OF THE INVENTION

Hereafter, embodiments of a nitride semiconductor device according to the present invention will be described in detail with reference to the accompanying drawings. By the way, the present invention is not restricted by the embodiments. Furthermore, sectional views of nitride semiconductor devices according to the embodiments hereafter described are schematic, and relations between layer thickness and width and ratios in thickness among layers are different from those in actuality.

First Embodiment

Figure 1:
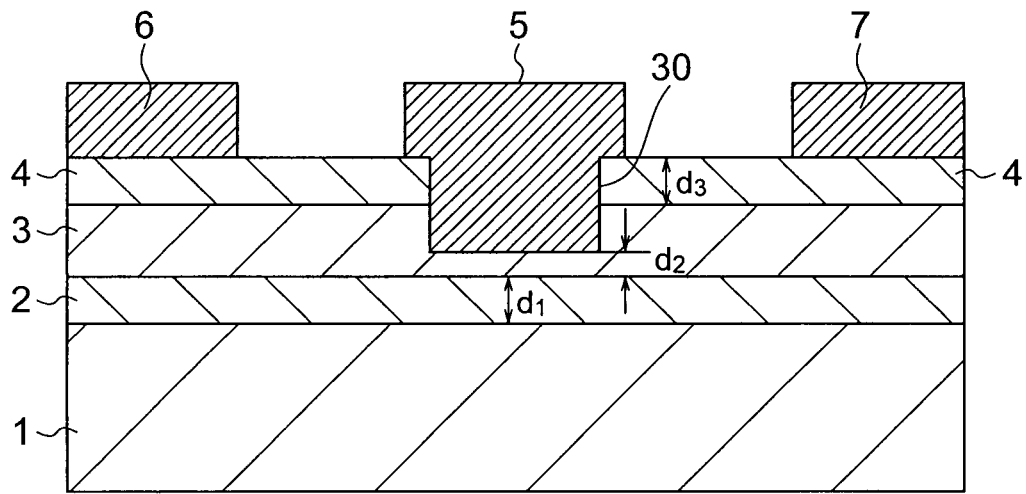
FIG. 1 is a sectional view showing a nitride semiconductor device according to a first embodiment.

FIG. 1 is a sectional view schematically showing a structure of a nitride semiconductor device according to a first embodiment of the present invention. The nitride semiconductor device has a configuration obtained by successively stacking a carrier transit layer 1 formed of a non-doped nitride semiconductor Al$_X$Ga$_{1-X}$N (0≤X<1), a barrier layer 2 formed of a non-doped or n-type nitride semiconductor Al$_Y$Ga$_{1-Y}$N (0<Y≤1, X<Y) which is smaller in lattice constant than the carrier transit layer 1, a threshold control layer 3 formed of a non-doped or n-type nitride semiconductor having a lattice constant equal to that of the carrier transit layer 1, and a carrier induction layer 4 formed of In$_W$Al$_Z$Ga$_{1-W-Z}$N (0<W≤1, 0<Z<1). In a position where a gate electrode 5 is formed, a recess structure 30 is formed by removing the whole of the carrier induction layer 4 and a part of the threshold control layer 3. A gate electrode 5 is formed so as to cover the recess structure 30. A source electrode 6 and a drain electrode 7 are formed in substantially symmetrical positions on the carrier induction layer 4 with the gate electrode 5 between. In FIG. 1, the recess structure 30 has a structure obtained by removing the whole of the carrier induction layer 4 and a part of the threshold control layer 3 in the region for forming the gate electrode 5. However, it is only necessary that the recess structure is not formed in the barrier layer 2 and the carrier induction layer 4 is removed. A structure with only the carrier induction layer 4 removed may be adopted.

As described above, the threshold control layer 3 needs only be a semiconductor material having the same lattice constant as the carrier transit layer 1 has. If the threshold control layer 3 and the carrier transit layer 1 are formed of the same material as shown in FIG. 1, however, the semiconductor can be fabricated by using a crystal growth equipment of one kind, superiority being attained over the case where different materials having the same lattice constant are used.

The barrier layer 2 has a film thickness less than or equal to a film thickness at which dislocation is caused by strain brought about by a difference in lattice constant between the barrier layer 2 and the carrier transit layer 1. As a matter of fact, the barrier layer 2 has a thickness in the range of approximately several nm to several tens nm. As a result, the lattice constant of the barrier layer 2 in a direction perpendicular to the stacked direction becomes substantially the same as the lattice constant of the carrier transit layer 1 in a direction perpendicular to the stacked direction, and the crystal structure of the barrier layer 2 becomes a structure stretched in the direction perpendicular to the stacked direction (substrate plane direction). In addition, since accordingly the threshold control layer 3 formed on the barrier layer 2 has the same lattice constant as that of the carrier transit layer 1, new strain is not caused between the threshold control layer 3 and the barrier layer 2. In the ensuing description, the thickness of the barrier layer 2 is denoted by $d_1$, the thickness of the threshold control layer 3 in the position where the recess structure 30 is formed is denoted by $d_2$, and the thickness of the carrier induction layer 4 is denoted by $d_3$.

According to a feature of the present embodiment, the recess structure is not formed so as to range from the surface of the nitride semiconductor device to a part of the barrier layer unlike the reference art, but formed so as to range from the surface of the nitride semiconductor device to the threshold control layer 3 formed on the barrier layer 2. In addition, the carrier induction layer 4 formed of $In_WAl_ZGa_{1-W-Z}N$ ($0<W\leq1$, $0<Z<1$) is provided between the gate electrode 5 and the source electrode 6 and between the gate electrode 5 and the drain electrode 7.

The state of electrons at the interface between the carrier transit layer 1 and the barrier layer 2 of the nitride semiconductor device according to this embodiment will now be described as to a position under the gate electrode 5 formed on the recess structure 30 and a position under the source electrode 6/the drain electrode 7 where the recess structure 30 is not formed.

Figure 2:
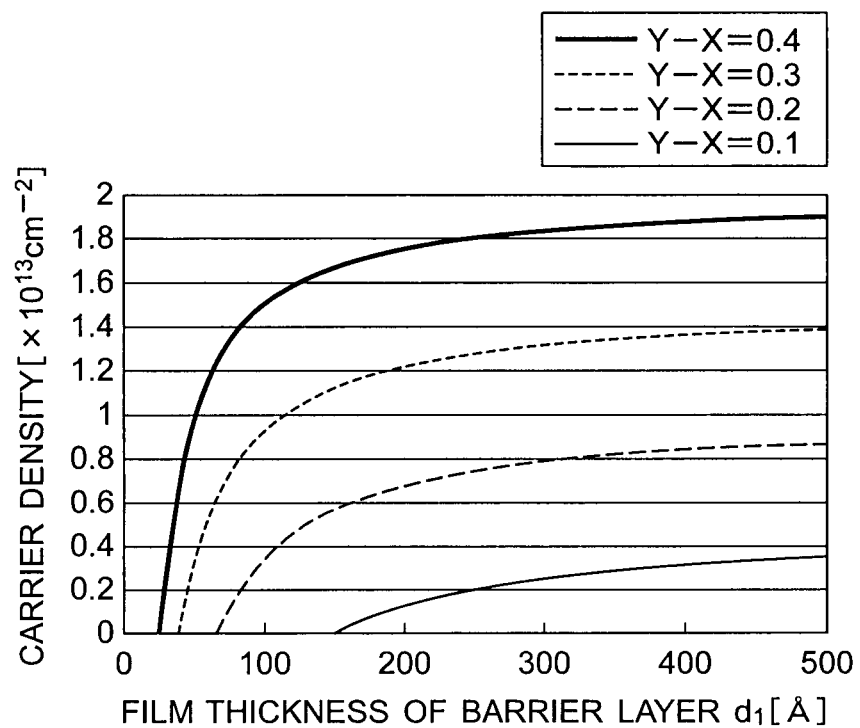
FIG. 2 is a diagram showing relations between a film thickness of a barrier layer and a carrier density in a nitride semiconductor device.
Figure 3:
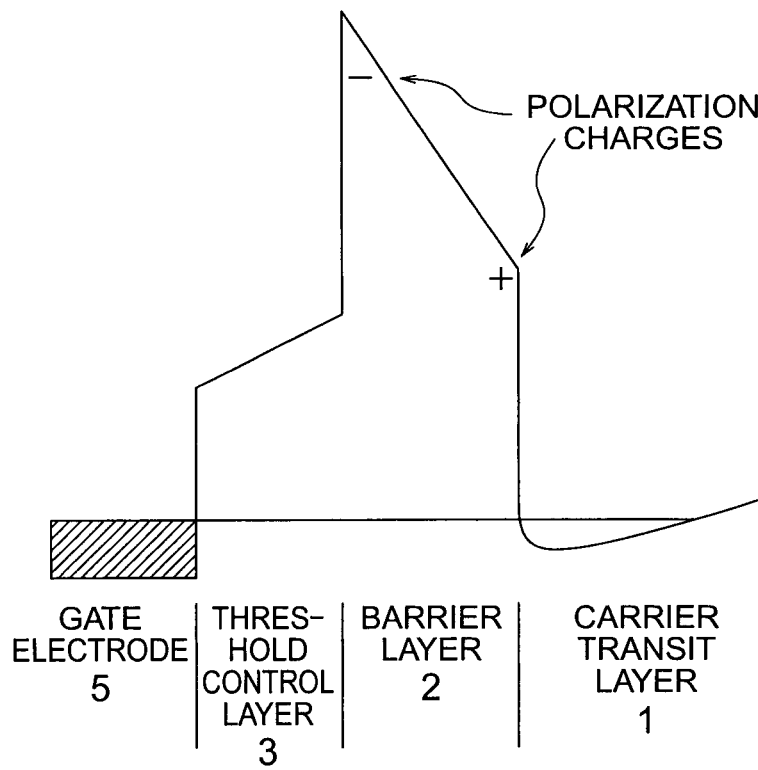
FIG. 3 is a diagram schematically showing an energy state of a conduction band in a depth direction at a position where a gate electrode in FIG. 1 is formed.
Figure 4:
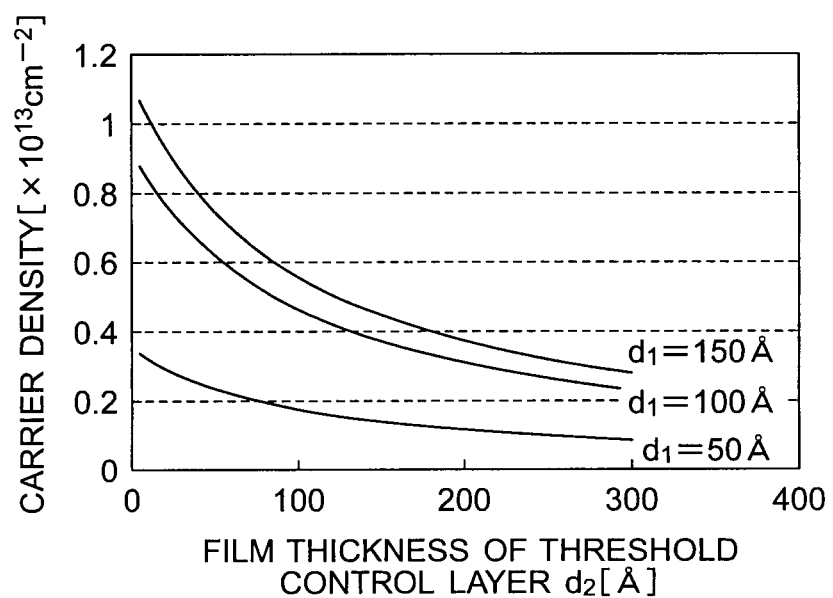
FIG. 4 is a diagram showing the carrier density under the gate when a carrier transit layer is formed of a GaN film and a barrier layer is formed of an Al$_{0.3}$Ga$_{0.7}$N film.
Figure 5:
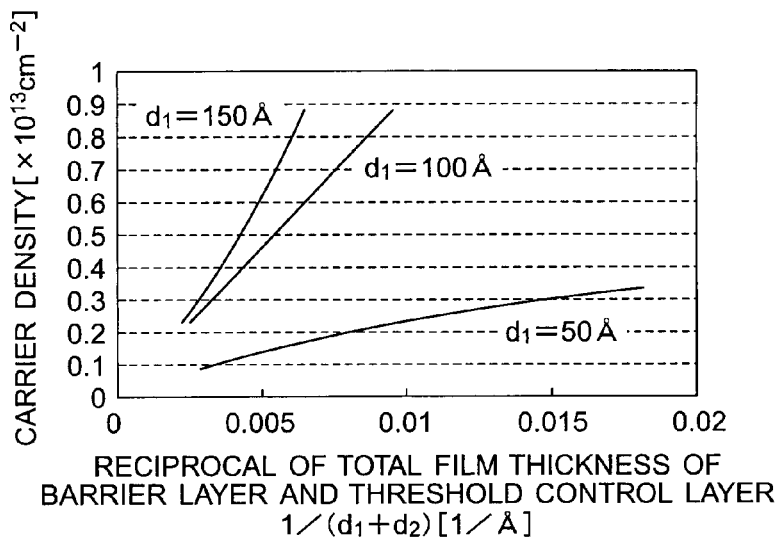
FIG. 5 is a diagram showing dependence of the carrier density upon a reciprocal of the sum of film thicknesses of the barrier layer and a threshold control layer.

First, the electron state at the interface between the carrier transit layer 1 and the barrier layer 2 under the gate electrode 5 will now be described. FIG. 2 is a diagram showing relations between the film thickness of the barrier layer and the carrier density in the nitride semiconductor device. FIG. 3 is a diagram schematically showing an energy state of a conduction band in a depth direction at a position where the gate electrode in FIG. 1 is formed. FIG. 4 is a diagram showing the carrier density under the gate when the carrier transit layer is formed of a GaN film and the barrier layer is formed of an $Al_{0.3}Ga_{0.7}N$ film. FIG. 5 is a diagram showing dependence of the carrier density upon a reciprocal of the sum of film thicknesses of the barrier layer and the threshold control layer.

In the conventional nitride semiconductor device described in BACKGROUND OF THE INVENTION, the gate electrode 5 is formed on the barrier layer 2. Therefore, piezo electric charges depend upon the film thickness of the barrier layer 2 under the gate electrode 5. As the film thickness of the barrier layer 2 under the gate electrode 5 increases, therefore, the carrier density increases as shown in FIG. 2.

On the other hand, in the nitride semiconductor device according to the present embodiment, the gate electrode 5 is formed on the threshold control layer 3. In the position where the gate electrode 5 is formed, therefore, polarization charges are generated only in the barrier layer 2, but polarization charges are not generated in the threshold control layer 3 as shown in FIG. 3. Therefore, the polarization charge concentration does not depend upon the film thickness $d_2$ of the threshold control layer 3 under the gate. Since the polarization charge concentration does not change, the carrier density decreases as the film thickness of the threshold control layer 3 increases as shown in FIG. 4. In this case, the carrier density is in inverse proportion to the total film thickness of the barrier layer 2 and the threshold control layer 3 as shown in FIG. 5. The gate capacitance per unit area is also in inverse proportion to the total film thickness of the barrier layer 2 and the threshold control layer 3. On the basis of these relations, the threshold voltage represented by (carrier density of the two-dimensional electron system under the gate electrode)/(gate capacitance per unit area) does not vary with the total film thickness of the barrier layer 2 and the threshold control layer 3.

In other words, in the nitride semiconductor device shown in FIG. 1, the threshold voltage does not change even if the etching depth varies when forming the recess structure, more specifically even if the film thickness $d_2$ left in the threshold control layer 3 varies. In addition, as for the barrier layer 2 which is not removed when forming the recess structure, strict film thickness of the barrier layer 2 can be exercised using an epitaxial crystal growth technique which can control the barrier layer thickness at an atomic layer level. As a result, it becomes possible to provide a nitride semiconductor device having a uniform threshold voltage with a high yield.

Figure 6:
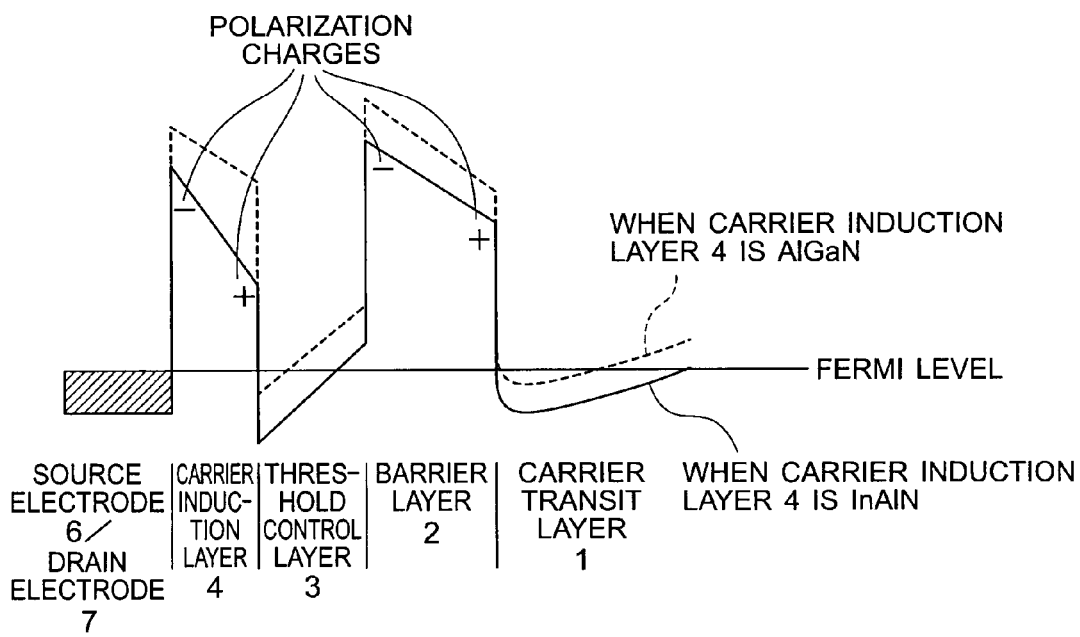
FIG. 6 is a diagram schematically showing an energy state of a conduction band in a depth direction at a position where a source electrode/drain electrode in FIG. 1 is formed.
Figure 7:
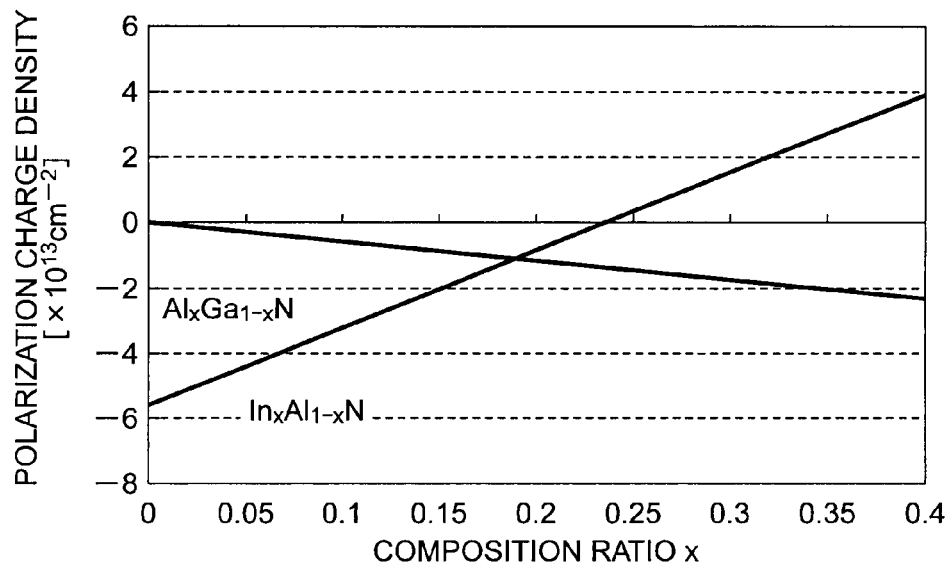
FIG. 7 is a diagram showing dependence of a polarization charge density upon a composition ratio.

The electron state at the interface between the carrier transit layer 1 and the barrier layer 2 in the position where the recess structure 30 is not formed (for example, under the source electrode 6/the drain electrode 7) will now be described. FIG. 6 is a diagram schematically showing the energy state of the conduction band in the depth direction at the position where the source electrode 6/the drain electrode 7 in FIG. 1 is formed. In the nitride semiconductor device shown in FIG. 1, the carrier induction layer 4 formed of $In_WAl_ZGa_{1-W-Z}N$ ($0<W\leq1$, $0<Z<1$) is formed between the source electrode 6 and the gate electrode 5 and between the drain electrode 7 and the gate electrode 5. Since the carrier induction layer 4 is smaller in lattice constant than the carrier transit layer 1 and the threshold control layer 3, polarization charges are generated in the carrier induction layer 4 so as to become positive on the threshold control layer 3 side as shown in FIG. 6. Because of the polarization charges, the potential of the conduction band in the carrier induction layer 4 has inclination and becomes lower on the carrier transit layer 1 side. The magnitude of the inclination depends upon the magnitude of polarization, and the inclination becomes large as the magnitude of the polarization becomes large. FIG. 7 shows dependence of the polarization charge density upon a composition ratio X when the carrier induction layer is formed of an InAlN material such as, $In_XAl_{1-X}N$ (obtained from $In_YAl_ZGa_{1-Y-Z}N$ by setting Y+Z=1) and when the carrier induction layer is formed of an AlGaN material such as, $Al_XGa_{1-X}N$. The magnitude of polarization is represented by the polarization charge density. When an AlGaN material is used for the carrier induction layer, the polarization charge density is at most equal to or less than $2\times10^{13}$ $cm^{-2}$ as appreciated from FIG. 7. On the other hand, the polarization charge density can assume a greater value when an InAlN material is used for the carrier induction layer. If an InAlN material is used for the carrier induction layer, therefore, the inclination of the energy band in the carrier induction layer becomes large. Since the inclination of the energy band is large and the surface level of the InAlN material (energy of the carrier induction layer on the surface side) is low, the energy is lowered on the whole when an InAlN material is used for the carrier induction layer as compared with when an AlGaN material is used as shown in FIG. 6. In particular, the energy at the interface between the carrier induction layer 4 and the threshold control layer 3 and at the interface between the barrier layer 2 and the carrier transit layer 1 falls downward remarkably lower than the Fermi level.

The two-dimensional electron system concentration becomes large as the energy level becomes lower than the Fermi level. In the present embodiment, therefore, the carrier concentration of the two-dimensional electron system at the interface between the carrier induction layer 4 and the threshold control layer 3 and the interface between the barrier layer 2 and the carrier transit layer 1 becomes large. In other words, the resistance value of the two-dimensional electron system under the region in which the carrier induction layer 4 is formed becomes lower. In the nitride semiconductor device according to the present embodiment in which the carrier induction layer is formed between the source electrode 6 and the gate electrode 5 and between the drain electrode 7 and the gate electrode 5, therefore, the resistance value between the source electrode 6 and the gate electrode 5 and between the drain electrode 7 and the gate electrode 5 is reduced, and reduction of the on-resistance is implemented.

Considering the lattice constant and band gap difference between the barrier layer 2 and the carrier transit layer 1, it is desirable that the Al composition ratio X of the barrier layer 2 formed of $Al_XGa_{1-X}N$ is in the range of 0.1 to 0.4. If the carrier induction layer is an $In_YAl_ZN$ film, it is desirable that the In composition ratio Y is approximately 0.2 or less because polarization which is larger in absolute value than the barrier layer 2 can be generated as appreciated from FIG. 7. Furthermore, it is desirable that the In composition ratio Y of the carrier induction layer 4 is at least 0.05 so as to prevent the difference in lattice constant from the carrier transit layer 1 from becoming so large. By further incorporating Ga into the carrier induction layer 4 to form an InAlGaN layer, the In composition ratio can be lowered and the epitaxial growth is facilitated. If the Ga composition ratio exceeds 60%, however, then the polarization charge density lowers and it becomes a polarization charge density that is easily induced also when the carrier induction layer is the AlGaN layer. Therefore, it is desirable that the Ga composition ratio of the carrier induction layer formed of InAlGaN is 60% or less.

In the nitride semiconductor device according to the present embodiment, it becomes possible to provide a semiconductor device having low on-resistance as heretofore described.

By the way, in the nitride semiconductor device according to the present embodiment shown in FIG. 1, polarization generated in the carrier induction layer 4 formed of an $In_YAl_ZGa_{1-Y-Z}N$ ($0 \leq Y \leq 1$, $0 < Z < 1$) film does not cancel polarization in the threshold control layer 3 which lies under the carrier induction layer 4 as shown in FIG. 6. Unlike the example in which the InAlGaN film is used as the contact layer described with reference to the reference art, therefore, the effect of preventing the depletion at the interface between the contact layer and the barrier layer by canceling the polarization is not obtained. As described above, however, it becomes possible to control the threshold voltage with a high yield and provide a nitride semiconductor device having low on-resistance by using a semiconductor device as in the present embodiment in which the threshold control layer 3 and the carrier induction layer 4 formed of an $In_YAl_ZGa_{1-Y-Z}N$ ($0 \leq Y \leq 1$, $0 < Z < 1$) film are stacked in order.

A manufacturing method of the nitride semiconductor device according to the present embodiment will now be described with reference to FIGS. 8A to 9B. The manufacturing method of the nitride semiconductor device described hereafter is an example. It is a matter of course that the nitride semiconductor device can be implemented by various other manufacturing methods including modifications.

Figure 8A:
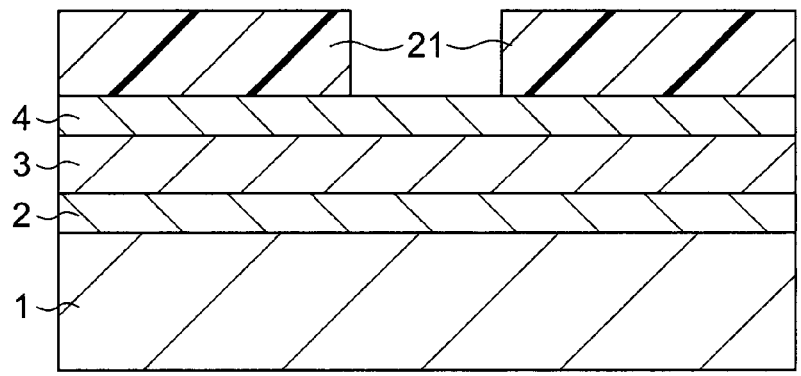
FIGS. 8A and 8B are sectional views showing a manufacturing process of a nitride semiconductor device according to the first embodiment.
Figure 8B:
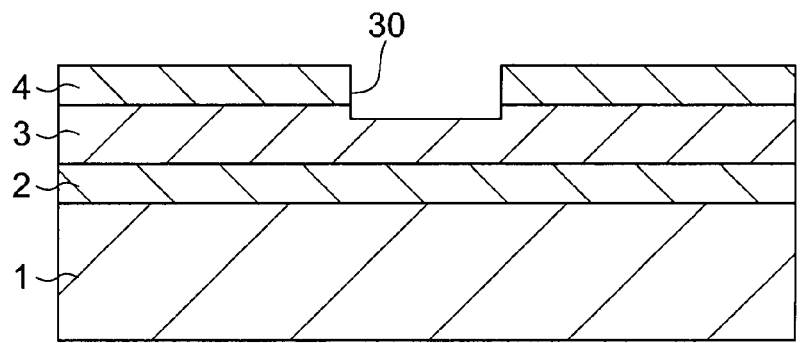

First, as shown in FIG. 8A, on a substrate having a predetermined film formed thereon as occasion demands which is not illustrated, a carrier transit layer 1 formed of a non-doped $Al_XGa_{1-X}N$ ($0 \leq X < 1$) film having a film thickness of approximately 2 µm, a barrier layer 2 formed of a non-doped or n-type $Al_YGa_{1-Y}N$ ($0 < Y \leq 1$, $X < Y$) film having a film thickness of approximately 5 nm, a threshold control layer 3 formed of a non-doped or n-type $Al_XGa_{1-X}N$ ($0 \leq X < 1$) film having a film thickness of approximately 5 nm, and a carrier induction layer 4 formed of non-doped $In_WAl_ZGa_{1-W-Z}N$ ($0 < W \leq 1$, $0 < Z < 1$) film having a film thickness of approximately 5 nm are grown successively. By the way, the carrier transit layer 1, the barrier layer 2, the threshold control layer 3 and the carrier induction layer 4 are formed by using an epitaxial crystal growth technique such as an MOCVD (Metal Organic Chemical Vapor Deposition) by which the film thickness can be controlled at an atomic layer level.

Since the Al composition ratio Y of the barrier layer 2 is greater than the Al composition ratio X of the carrier transit layer 1 (X<Y), the lattice constant of the barrier layer 2 becomes smaller than the lattice constant of the carrier transit layer 1. Furthermore, since the epitaxial growth is caused and the film thickness of each of the barrier layer 2 and the carrier induction layer 4 is thinner than a film thickness at which the dislocation occurs, crystal of the semiconductor film forming the barrier layer 2 and the carrier induction layer 4 is grown according to the crystal structure of the underlying layers and expanded in a direction perpendicular to the layer stacking direction (in-plane direction of the growth plane), resulting in a structure having strain.

Subsequently, a photoresist is applied onto the carrier induction layer 4. The photoresist is exposed and developed by using the photolithography technique. As a result, an etching mask 21 is formed of the photoresist (see FIG. 8A).

Subsequently, a part of the carrier transit layer 4 and the threshold control layer 3 is selectively removed by using the etching mask 21 and a technique such as the reactive ion etching (RIE). As a result, the recess structure 30 is formed, and then the etching mask 21 is removed (see FIG. 8B).

Figure 9A:
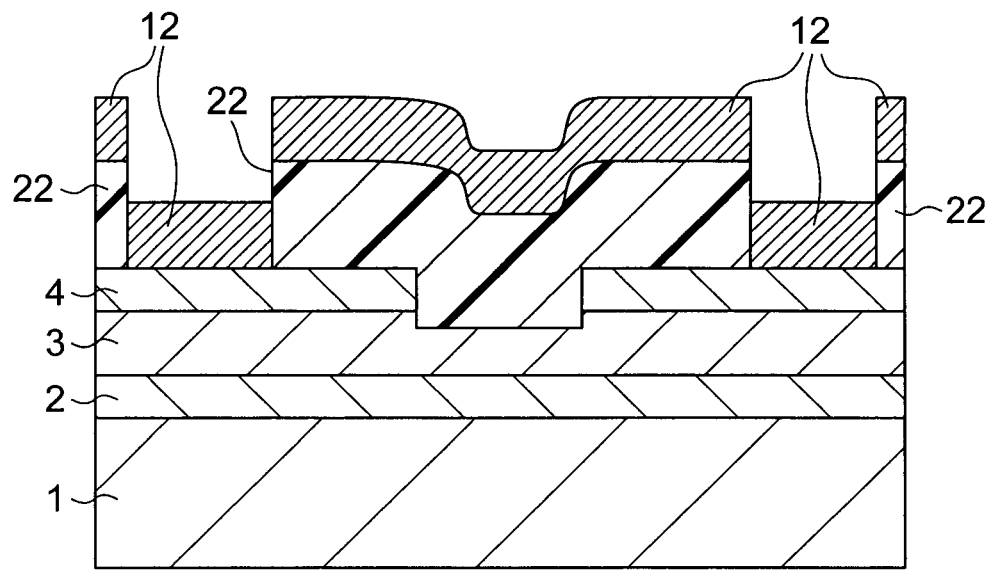
FIGS. 9A and 9B are sectional views showing a manufacturing process of a nitride semiconductor device according to the first embodiment.
Figure 9B:
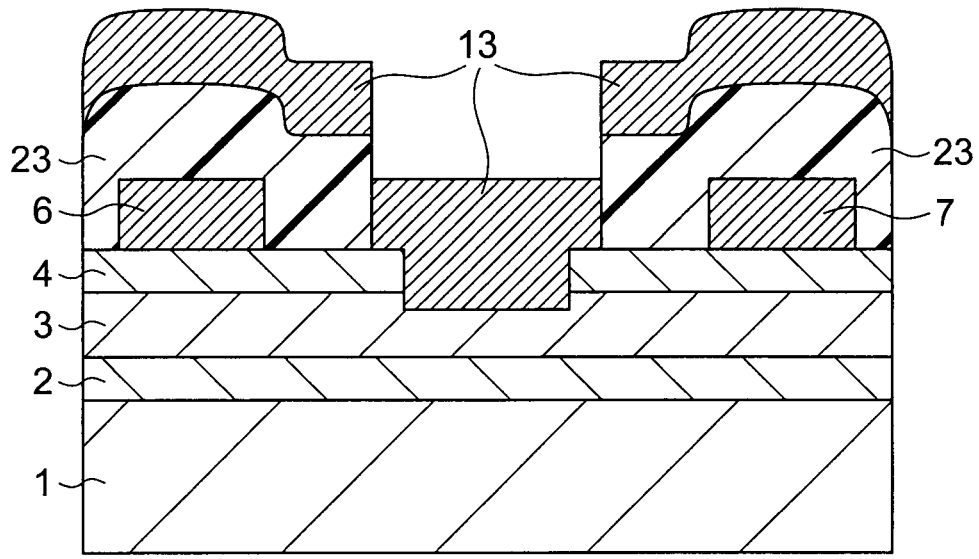

Subsequently, a new photoresist is applied onto the whole surface, and then exposure and development are conducted by using the photolithography technique as shown in FIG. 9A. As a result, a resist pattern 22 with the photoresist in forming regions of the drain and source electrodes on the carrier induction layer 4 removed is formed. Thereafter, an electrode metal film 12 is deposited on the whole surface (see FIG. 9A).

Subsequently, the drain electrode 7 and the source electrode 6 are formed by using a lift-off method for removing the resist pattern 22. Subsequently, a new photoresist is applied onto the whole surface, and then exposure and development are conducted by using the photolithography technique. As a result, a resist pattern 23 with the photoresist in a forming region of the gate electrode 5 removed is formed. Thereafter, an electrode metal film 13 is deposited on the whole surface (see FIG. 9B). Subsequently, the gate electrode 5 is formed by using a lift-off method for removing the resist pattern 23. The nitride semiconductor device according to the present embodiment shown in FIG. 1 is thus completed.

According to the manufacturing method of the nitride semiconductor device according to the present embodiment, it is possible to control precisely at an atomic layer level the film thickness of the barrier layer 2 which exerts influence upon the variation of the threshold voltage. In addition, since the total thickness value of the threshold control layer 3 and the barrier layer 2 under the recess structure 30 does not affect the threshold voltage, a high precision is not needed for etching of the threshold control layer 3 when forming the recess structure 30. As a result, the threshold voltage can be controlled easily. It becomes possible to provide a nitride semiconductor device having low on-resistance with high yield.

Figure 10:
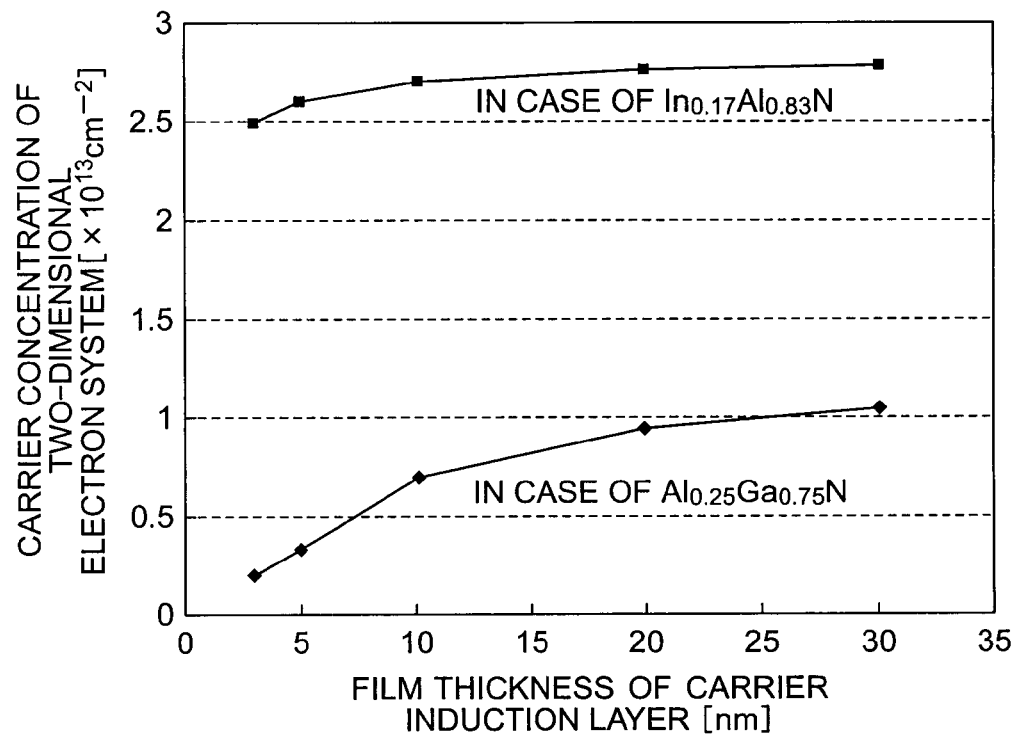
FIG. 10 is a diagram showing dependence of a total value of carrier concentrations of a two-dimensional electron system generated at an interface.

In the above-described manufacturing method, there is a possibility that etching damage will be introduced when conducting dry etching using the RIE method to form the gate recess structure. For reducing the etching damage, it is effective to reduce the film thickness of the carrier induction layer 4 to reduce the etching depth. If the film thickness of the carrier induction layer 4 is reduced, there is a fear that the potential difference between the surface side and substrate side of the carrier induction layer 4 in the potentials of the conduction band shown in FIG. 6 will become small and the two-dimensional electron system carriers of a sufficient quantity will not be generated. FIG. 10 is a diagram showing dependence of the total value of carrier concentrations of the two-dimensional electron system generated at the interface between the carrier induction layer 4 and the threshold control layer 3 and at the interface between the electron transit layer 1 and the barrier layer 2 when the carrier induction layer is formed of an AlGaN film and when the carrier induction layer is formed of an InAlN film upon the film thickness of the carrier induction layer. If the carrier induction layer is the AlGaN film, the carrier concentration abruptly decreases when the film thickness of the carrier induction layer 4 is 10 nm or less. On the other hand, if the carrier induction layer is the InAlN film, the carrier concentration is large in value even when the film thickness of the carrier induction layer is 10 nm or less. If the $In_YAl_ZGa_{1-Y-Z}N$ ($0<Y\le1$, $0<Z<1$) film is used as the carrier induction layer 4, therefore, the etching damage caused by small film thickness can be reduced and a large carrier concentration of the two-dimensional electron system can be obtained. As a result, it becomes possible to provide a semiconductor device having small on-resistance. By the way, the carrier induction layer 4 can induce carriers of the two-dimensional electron system sufficiently even if the film thickness of the carrier induction layer 4 is small. It is desirable that the film thickness of the carrier induction layer 4 required to stably generate the polarization is at least 1 nm in order to induce carriers of the two-dimensional electron system by polarization in the carrier induction layer 4 and reduce the on-resistance. If the $In_YAl_ZGa_{1-Y-Z}N$ ($0<Y\le1$, $0<Z<1$) film is used as the carrier induction layer 4, therefore, it is desirable that the film thickness is at least 1 nm. If the film thickness is 10 nm or less, however, it becomes possible to make the carrier concentration of the two-dimensional electron system large as compared with the case where the AlGaN film is used, and it is more desirable.

A condition for implementing the normally-off type structure in the nitride semiconductor device according to the embodiment will now be described. In the nitride semiconductor device according to the present embodiment shown in FIG. 1, the quantity of polarization charges generated in the barrier layer does not depend upon whether the threshold control layer 3 is present. Therefore, a critical film thickness $T_C$ of the barrier layer 2 at which carriers are generated under the gate electrode 5 becomes $$T_C=16.4\times(1-1.27\times(Y-X))/(Y-X)[\text{Å}] \qquad (4)$$

Figure 11:
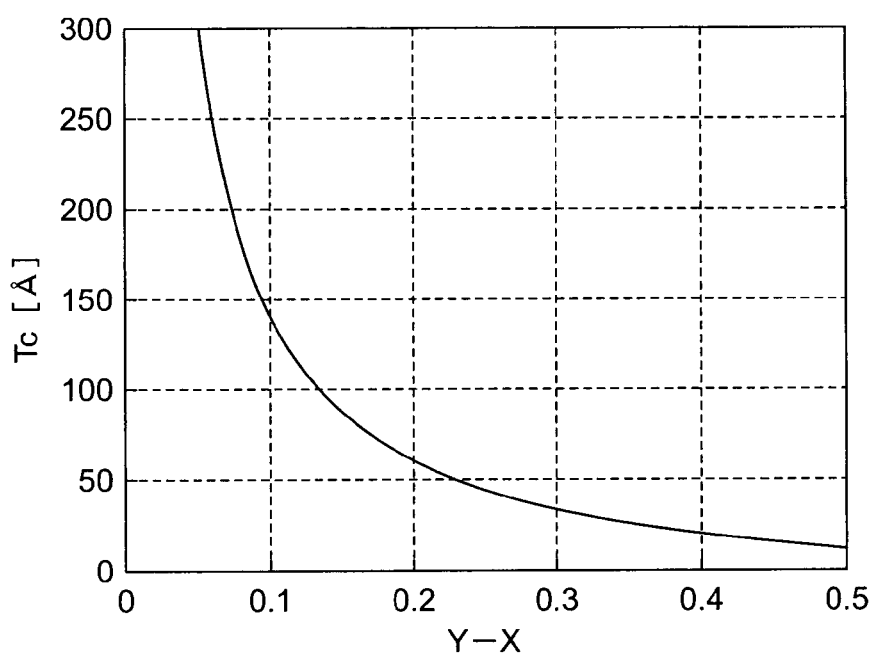
FIG. 11 is a diagram showing dependence of a critical film thickness upon a difference in composition ratio between a carrier transit layer and a barrier layer.

Here, X is the Al composition ratio of the carrier transit layer 1, and Y is the Al composition ratio of the barrier layer 2. The reason why the critical film thickness $T_C$ is the function of (Y−X) in the equation (4) is that the difference in lattice constant between the carrier transit layer 1 and the barrier layer 2 can be represented as a difference in composition ratio between them. FIG. 11 shows dependence of the critical film thickness $T_C$ upon the difference (Y−X) in composition ratio between the carrier transit layer 1 and the barrier layer 2. FIG. 11 represents the equation (4) as a graph, and shows dependence of the critical film thickness $T_C$ upon the Al composition ratio. Therefore, it becomes possible to cause the carrier concentration of the two-dimensional electron system formed under the gate electrode 5 to become zero by setting the film thickness $d_1$ of the barrier layer 2 equal to the critical film thickness $T_C$ or less. The normally-off type nitride semiconductor device can be implemented. In this case, however, the critical film thickness $T_C$ needs to be positive in the equation (4) and consequently the condition $(Y-X)<1/1.27$ ($=0.787$) needs to be satisfied.

Figure 12:
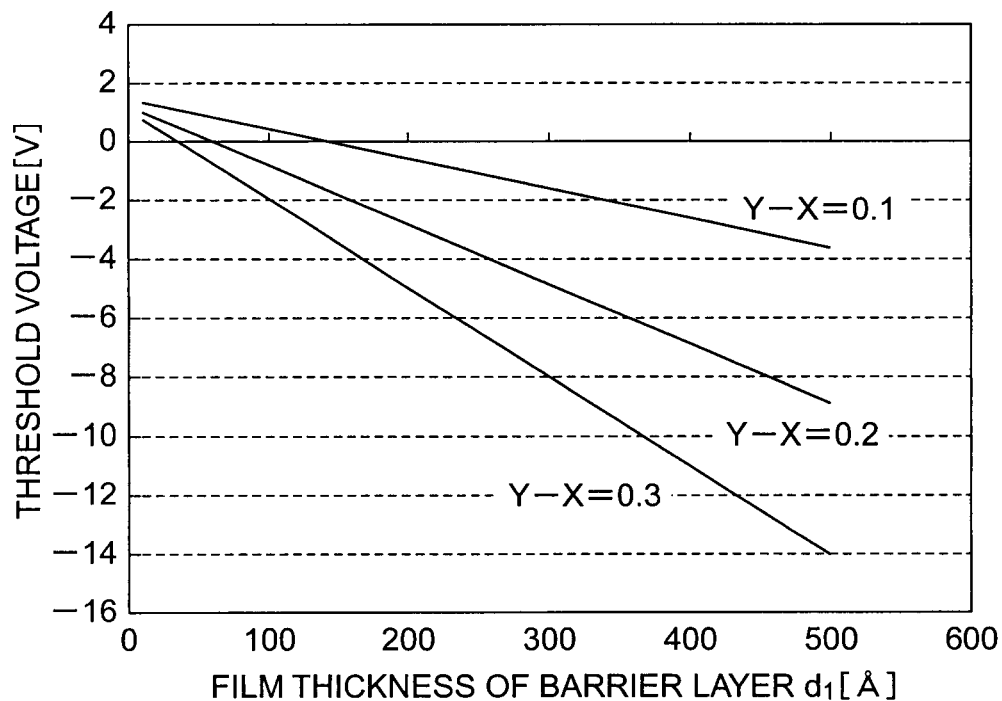
FIG. 12 is a diagram showing relations between a film thickness of a barrier layer and a threshold voltage.

When attempting to implement a normally-off type nitride semiconductor device by using the recess structure, etching is conducted to cause the barrier layer 2 under the gate electrode 5 to have a thickness which is equal to the critical film thickness or less in the conventional semiconductor device described in "BACKGROUND OF THE INVENTION." FIG. 12 is a diagram showing relations between the film thickness of the barrier layer and the threshold voltage. FIG. 12 shows relations between the film thickness of the barrier layer 2 and the threshold voltage obtained when the difference (Y−X) in Al composition ratio between the barrier layer 2 and the carrier transit layer 1 is changed from 0.1 to 0.3. As shown in FIG. 12, inclination of each straight line is large, and consequently the threshold voltage depends largely upon the etching depth. For example, when Y−X=0.3, therefore, the variation of the threshold voltage becomes as large as 0.3 V even if the variation of the etching depth is as comparatively small as 10 Å.

In the present embodiment, therefore, the barrier layer 2 controlled in film thickness is formed by using an epitaxial crystal growth apparatus capable of controlling the film thickness at an atomic layer level, and a part of the threshold control layer 3 which is formed on the barrier layer 2 and the film thickness of which does not affect the threshold voltage is removed to form the recess structure. Accordingly, the threshold voltage is determined by the barrier layer 2 controlled in film thickness at the atomic layer level. As a result, a normally-off type nitride semiconductor device that has a small variation in threshold voltage is obtained.

In the nitride semiconductor device according to the present embodiment shown in FIG. 1, the carrier induction layer 4 having a film thickness of $d_3$ is formed between the gate electrode 5 and the source electrode 6 and between the gate electrode 5 and the drain electrode 7. Therefore, piezo charges are caused in the carrier induction layer 4 which is smaller in lattice constant that the carrier transit layer 1 by generation of strain. As a result, carriers of the two-dimensional electron system are generated at the interface between the carrier transit layer 1 and the barrier layer 2. In other words, the two-dimensional electron gas generated at the interface between the barrier layer 2 and the carrier transit layer 1 depends upon the total film thickness of the barrier layer 2 and the carrier induction layer 4. As a result, the resistance between the gate electrode 5 and the source electrode 6 and the resistance between the gate electrode 5 and the drain electrode 7 can be reduced.

(First Modification)

Figure 13:
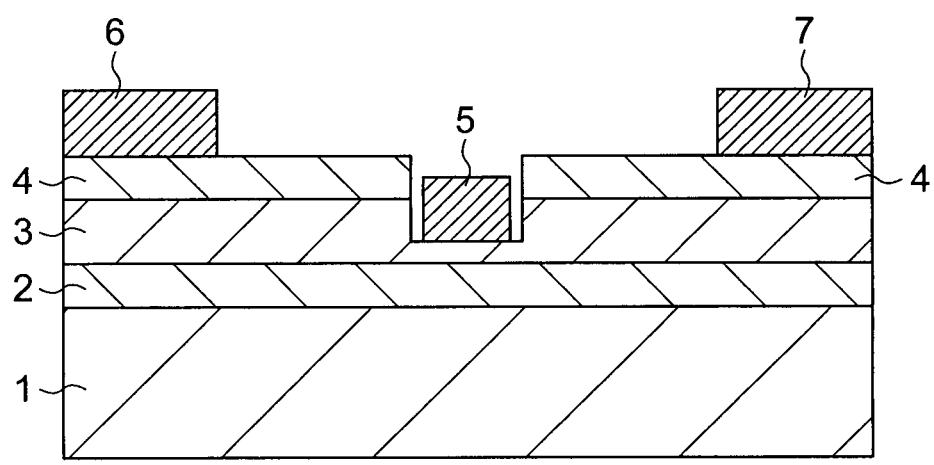
FIG. 13 is a sectional view showing a nitride semiconductor device according to a first modification of the first embodiment.

A nitride semiconductor device according to a first modification of the present embodiment is shown in FIG. 13. The nitride semiconductor device according to the modification differs from that according to the first embodiment shown in FIG. 1 in that the gate electrode 5 is formed on the threshold control layer 3, but the gate electrode 5 is not in contact with the carrier induction layer 4. In the case where the whole of the recess structure is filled with the gate electrode 5 as in the first embodiment shown in FIG. 1, an unexpected gap is caused between the gate electrode 5 and the carrier induction layer 4 in some cases. On the other hand, in the present modification, it becomes possible to fabricate the nitride semiconductor device with a high yield by previously keeping the gate electrode 5 apart from the carrier induction layer 4. It is sufficient that a part of the gate electrode 5 is thus formed on the threshold control layer 3 and the shape of the gate electrode does not matter.

In the present modification as well, a nitride semiconductor device in which the threshold voltage can be controlled easily and the on-resistance is low can be provided with a high yield in the same way as the first embodiment. In addition, a normally-off type nitride semiconductor device having low on-resistance can be provided with a high yield.

(Second and Third Modifications)

Figure 14:
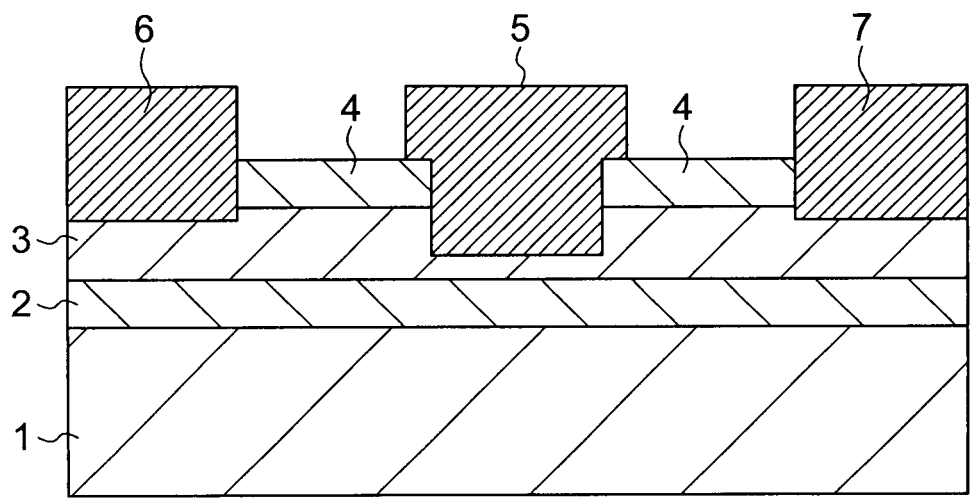
FIG. 14 is a sectional view showing a nitride semiconductor device according to a second modification of the first embodiment.
Figure 15:
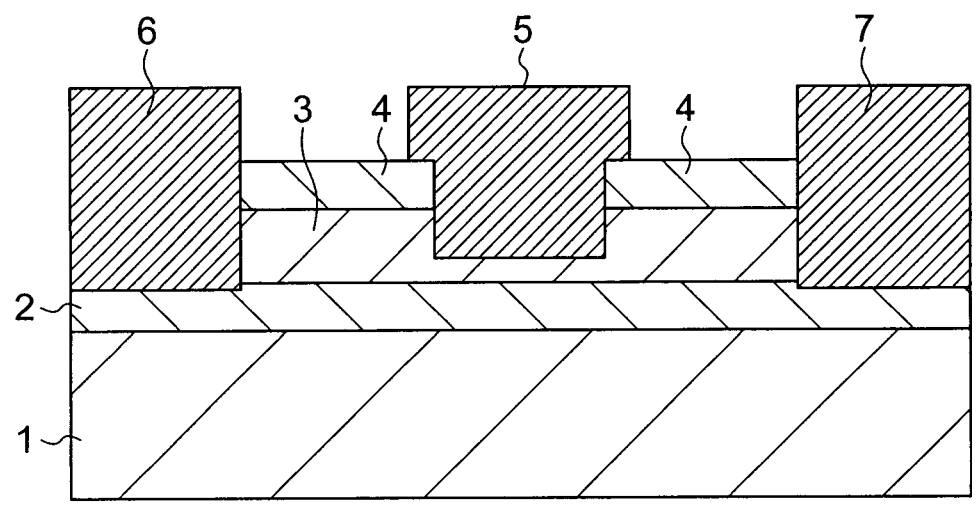
FIG. 15 is a sectional view showing a nitride semiconductor device according to a third modification of the first embodiment.

A nitride semiconductor device according to a second modification of the first embodiment is shown in FIG. 14, and a nitride semiconductor device according to a third modification is shown in FIG. 15. Both the second and third modifications differ from the first embodiment shown in FIG. 1 in that the source electrode 6 and the drain electrode 7 are not formed on the carrier induction layer 4. In the second modification shown in FIG. 14, the source electrode 6 and the drain electrode 7 are formed on the threshold control layer 3. In the third modification shown in FIG. 15, the source electrode 6 and the drain electrode 7 are formed on the barrier layer 2. Since the threshold control layer 3 is provided to control the threshold voltage and the carrier induction layer 4 is provided to reduce the resistance between the gate electrode 5 and the source electrode 6 and the resistance between the gate electrode 5 and the drain electrode 7 as described above, the threshold control layer 3 and the carrier induction layer 4 are not necessarily needed under the source electrode 6 and the drain electrode 7. Therefore, layers respectively connected to the source electrode 6 and the drain electrode 7 can be freely set. The ohmic contact resistance can be lowered and the on-resistance can be lowered by removing the carrier induction layer 4 or the threshold control layer 3 located under the source electrode 6 and the drain electrode 7 and consequently forming the source electrode 6 and the drain electrode 7 near the carriers of the two-dimensional electron system generated at the interface between the carrier transit layer 1 and the barrier layer 2.

In the second and third modifications as well, a nitride semiconductor device in which the threshold voltage can be controlled easily and the on-resistance is low can be provided with a high yield in the same way as the first embodiment. In addition, a normally-off type nitride semiconductor device having low on-resistance can be provided with a high yield.

Second Embodiment

Figure 16:
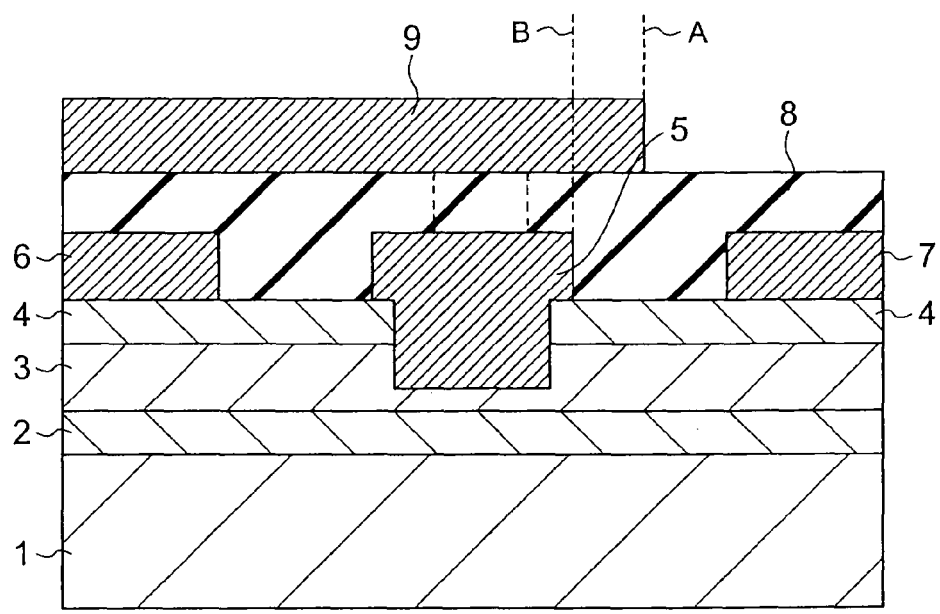
FIG. 16 is a sectional view showing a nitride semiconductor device according to a second embodiment.

A nitride semiconductor device according to a second embodiment of the present invention is shown in FIG. 16. The nitride semiconductor device according to the present embodiment has a configuration obtained from the first embodiment shown in FIG. 1 by providing an insulation film 8 so as to cover the carrier induction layer 4, the gate electrode 5, the source electrode 6 and the drain electrode 7 and providing a field plate electrode 9 on the insulation film 8 so as to overlap the gate electrode 5, the source electrode 6, and the carrier induction layer 4 between the gate electrode 5 and the source electrode 6.

The field plate electrode 9 is formed to extend from its first end on the insulation film 8 on a side having the source electrode 6 under, to its second end A located on the drain electrode 7 side as compared with an end B of the gate electrode 5 on the carrier induction layer 4 on the drain electrode 7 side (the right side in FIG. 16). In FIG. 16, the first end of the field plate electrode 9 is formed on the end of the insulation film 8 having the source electrode 6 formed under. However, the first end can be formed freely between the source electrode 6 and the drain electrode 7 as long as the second end A of the field plate electrode 9 is located between the end B of the gate electrode 5 on the drain electrode 7 side and the drain electrode 7.

When a high voltage is applied between the source electrode 6 and the drain electrode 7, concentration of the electric field near the gate electrode 5 can be reduced and a high breakdown voltage nitride semiconductor device can be implemented by thus providing the field plate electrode 9. It is desirable to connect the field plate electrode 9 to the gate electrode 5 or the source electrode 6.

In the present embodiment as well, a nitride semiconductor device in which the threshold voltage can be controlled easily and the on-resistance is low can be provided with a high yield in the same way as the first embodiment. In addition, a normally-off type nitride semiconductor device having low on-resistance can be provided with a high yield. As a result, a nitride semiconductor device in which the threshold voltage can be controlled easily and the on-resistance is low while implementing a high breakdown voltage can be provided with a high yield.

Third Embodiment

Figure 17:
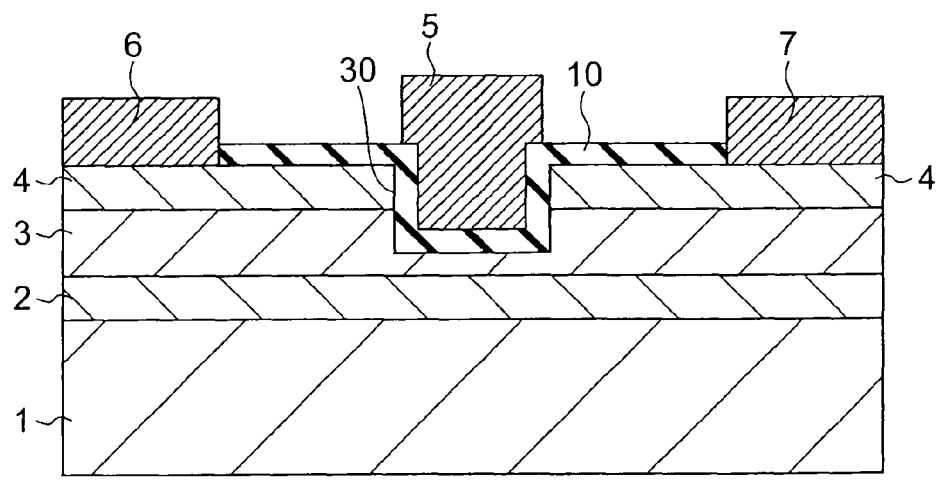
FIG. 17 is a sectional view showing a nitride semiconductor device according to a third embodiment.

A nitride semiconductor device according to a third embodiment of the present invention is shown in FIG. 17. The nitride semiconductor device according to the present embodiment has a configuration obtained from the first embodiment shown in FIG. 1 by providing a gate insulation film 10 on the bottom face and side faces of the recess structure 30 and on the carrier induction layer 4 between the gate electrode 5 and the source electrode 6 and between the gate electrode 5 and the drain electrode 7. In other words, the nitride semiconductor device according to the present embodiment has a configuration in which the gate electrode 5 is formed in the recess structure 30 via the gate insulation film 10. Preferably, a SiN film which is reported to have a low interface level with an AlGaN film is used as the gate insulation film 10. For controlling the threshold voltage, the gate electrode 5 needs only to be located over the threshold control layer 3 and it is not necessary that the gate electrode 5 is in direct contact with the threshold control layer 3.

The gate leak current can be reduced by thus providing the gate insulation film 10 between the gate electrode 5 and the threshold control layer 3 as in the present embodiment.

In the present embodiment as well, a nitride semiconductor device in which the threshold voltage can be controlled easily and the on-resistance is low can be provided with a high yield in the same way as the first embodiment. In addition, a normally-off type nitride semiconductor device having low on-resistance can be provided with a high yield. As a result, a nitride semiconductor device in which the threshold voltage can be controlled easily and the on-resistance is low while implementing a low leak current can be provided with a high yield.

(Modification)

Figure 18:
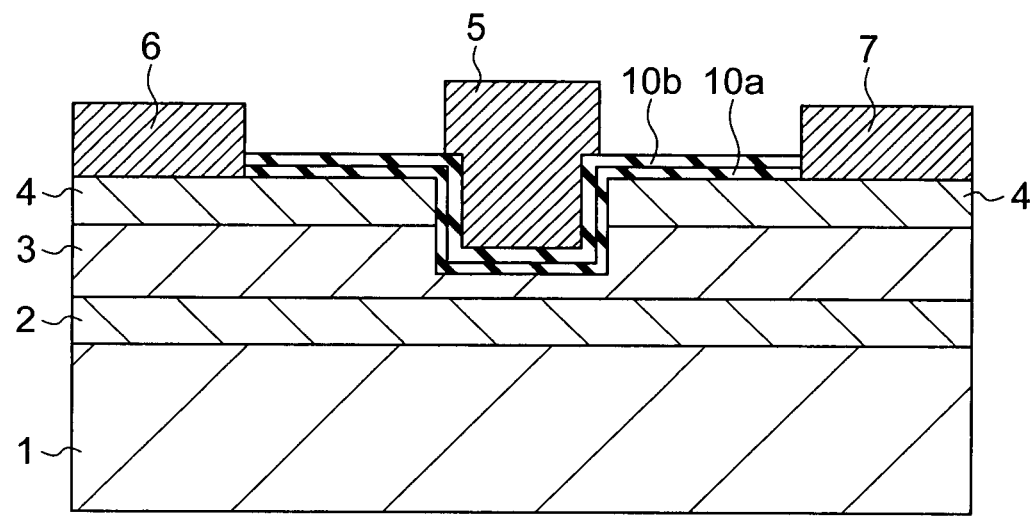
FIG. 18 is a sectional view showing a nitride semiconductor device according to a modification of the third embodiment.

A nitride semiconductor device according to a modification of the third embodiment is shown in FIG. 18. The nitride semiconductor device according to the present modification has a configuration obtained from the third embodiment shown in FIG. 17 by providing the gate insulation film 10 with a two-layer structure having gate insulation films 10a and 10b. A gate having a high breakdown voltage and controllability with a high carrier density can be formed by using a material which is low in interface level with the threshold control layer 3 for the lower gate insulation film 10a and using a material which is large in destructive critical electric field strength for the upper gate insulation film 10b. For example, a gate having a high breakdown voltage can be formed by using a SiN film for the gate insulation film 10a and using a $SiO_2$ film, an $Al_2O_3$ film or an AlN film for the gate insulation film 10b.

In the present modification as well, a nitride semiconductor device in which the threshold voltage can be controlled easily and the on-resistance is low can be provided with a high yield in the same way as the third embodiment. In addition, a normally-off type nitride semiconductor device having low on-resistance can be provided with a high yield.

Fourth Embodiment

Figure 19:
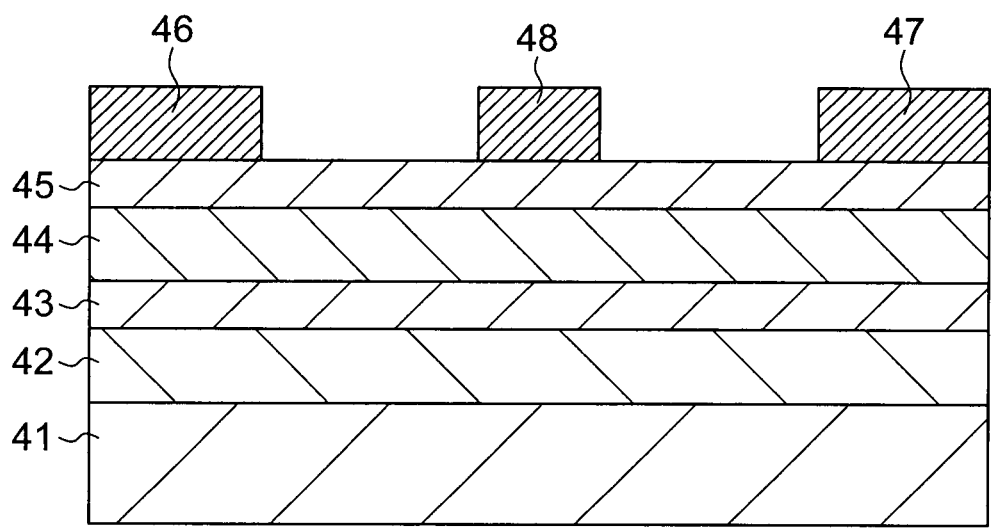
FIG. 19 is a sectional view showing a nitride semiconductor device according to a fourth embodiment.

A nitride semiconductor device according to a fourth embodiment of the present invention is shown in FIG. 19. As shown in FIG. 19, the nitride semiconductor device according to the present embodiment has a buffer layer 41 formed of a GaN film, a first underlying layer 42 formed of an $In_{0.3}Al_{0.7}N$ film, a second underlying layer 43 formed of an AlGaN film, a channel layer 44 formed of a GaN film, and a barrier layer 45 formed of an AlGaN film stacked in the cited order. A source electrode 46, a drain electrode 47 and a gate electrode 48 are formed on the barrier layer 45.

Figure 20:
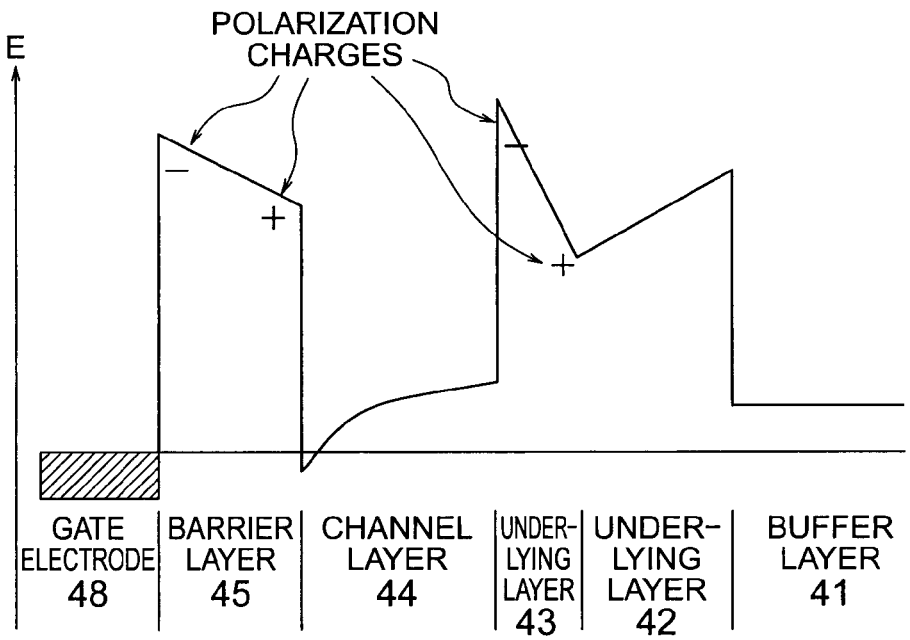
FIG. 20 is a diagram schematically showing an energy state of a conduction band in a depth direction at a position where a gate electrode in FIG. 19 is formed.

Typically, in the InAlN film, the spontaneous polarization and the piezo polarization cancel each other with an In composition ratio near 0.3. Therefore, the InAlN film can be formed so as to prevent the polarization from being generated. In the nitride semiconductor device according to the fourth embodiment, therefore, polarization is not generated in the first underlying layer 42. On the other hand, the second underlying layer 43 is formed of the AlGaN film so as to have negative polarization charges on the channel layer 44 side and have positive polarization charges on the first underlying layer 42 side as shown in FIG. 20. As a result, energy in the channel layer 44 on the second underlying layer 43 side rises as shown in FIG. 20. As a result, generation of carriers remaining on the second underlying layer 43 side of the channel layer 44 can be prevented effectively. In the nitride semiconductor device according to the present embodiment shown in FIG. 19, therefore, the pinch-off characteristics can be improved.

Figure 21:
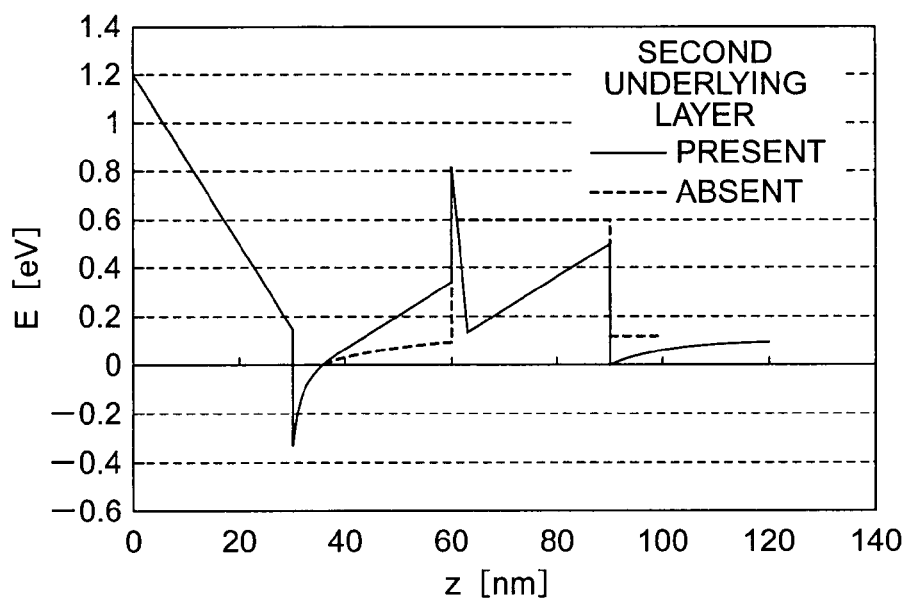
FIG. 21 is a diagram showing a calculation result of energy of a conduction band in a nitride semiconductor device according to a first embodiment.

FIG. 21 is a diagram showing energy in the conduction band calculated when using a GaN film as the buffer layer 41, an $In_{0.3}Al_{0.7}N$ film having a film thickness of 27 nm as the first underlying layer 42, an $Al_{0.3}Ga_{0.7}N$ film having a film thickness of 3 nm as the second underlying layer 43, a GaN film having a film thickness of 30 nm as the channel layer 44, and an $Al_{0.3}Ga_{0.7}N$ film having a film thickness of 30 nm as the barrier layer 5. The abscissa axis in FIG. 21 indicates the distance from the interface between the gate electrode 48 and the barrier layer 45. The case where completely the same layer structure is used except the second underlying layer 43 is removed and the first underlying layer 42 is formed of an $In_{0.3}Al_{0.7}N$ film having a film thickness of 30 nm is also indicated by a dotted line in FIG. 21. As appreciated from FIG. 21, the conduction band energy in the channel layer 44 between x=30 nm and x=60 nm is raised by inserting the AlGaN film having a film thickness of 3 nm as the second underlying layer 43. Particularly the energy in the channel layer 44 on the second under lying layer 43 side is largely increased. As a result, it becomes possible to effectively prevent carriers remaining in the channel layer 44 from being generated. In the nitride semiconductor device according to the present embodiment shown in FIG. 19, therefore, the pinch-off characteristics can be improved.

Figure 22:
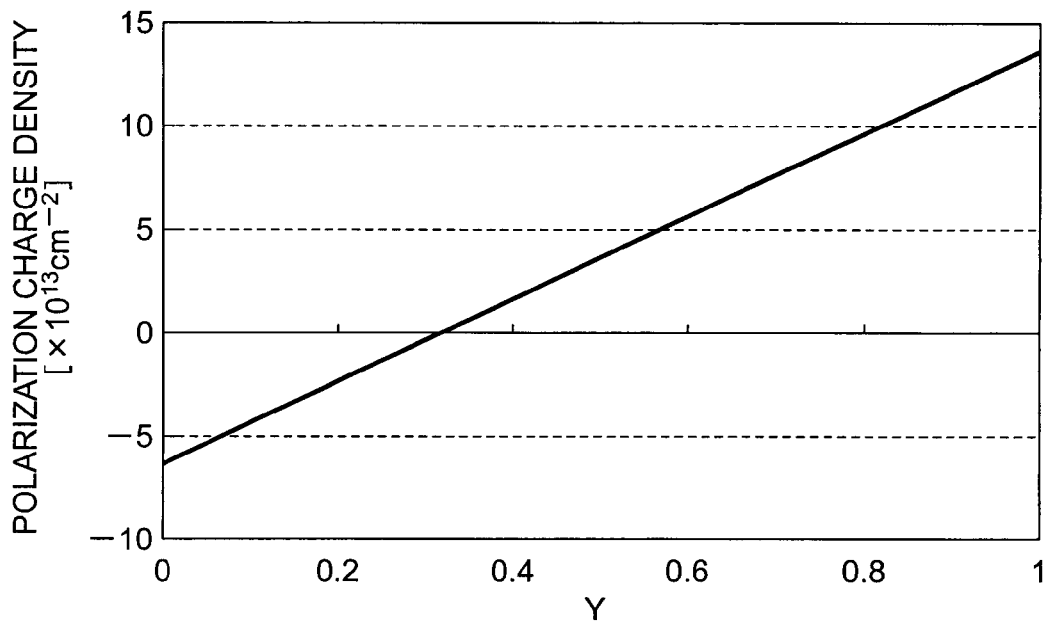
FIG. 22 is a diagram showing relations between an In composition ratio in an InAlN film and polarization charges generated in the InAlN film.
Figure 23:
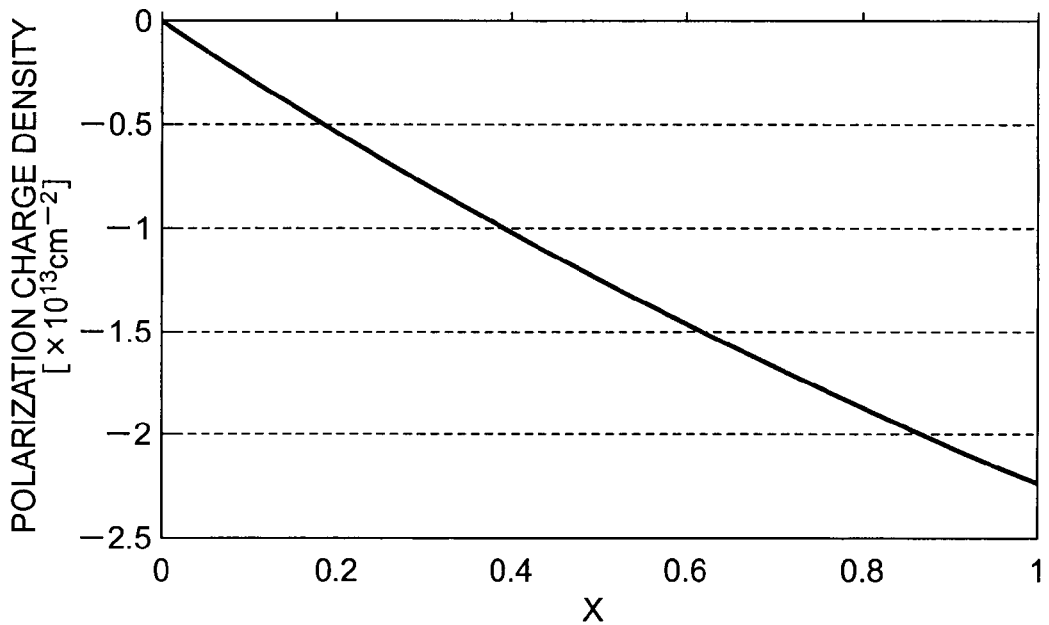
FIG. 23 is a diagram showing relations between a Ga composition ratio in an InAlGaN film and polarization charges generated in the InAlGaN film.

A desirable composition ratio for the first underlying layer 42 and the second underlying layer 43 will now be described. If a layer formed on the buffer layer 41 is different in lattice constant in a direction perpendicular to the stacked direction from the GaN film of the buffer layer 41, strain is caused so as to make the lattice constant the same as that of the buffer layer 41. As a result, piezo polarization is caused in the layer subjected to strain. Each of the layers has spontaneous polarization according to a composition ratio of the film which forms the layer. FIG. 22 is a diagram showing a polarization charge density which appears in an $In_YAl_{1-Y}N$ film when the $In_YAl_{1-Y}N$ film is used as the underlying layer. FIG. 23 is a diagram showing a polarization charge density which appears in an $(In_{0.2}Al_{0.8})_XGa_{1-X}N$ film when the $(In_{0.2}Al_{0.8})_XGa_{1-X}N$ film is used as the underlying layer. As appreciated from FIG. 22, the polarization charge density becomes zero when Y is approximately 0.3. When Y is less than 0.3, negative polarization charges are generated on the substrate surface side and positive polarization charges are generated on the buffer layer 41 side. When Y is greater than 0.3, positive polarization charges are generated on the substrate surface side and negative polarization charges are generated on the buffer layer 41 side. As appreciated from FIG. 23, the polarization charge density is nearly in proportion to the value of X when the In composition ratio assumes a certain fixed value.

Figure 24:
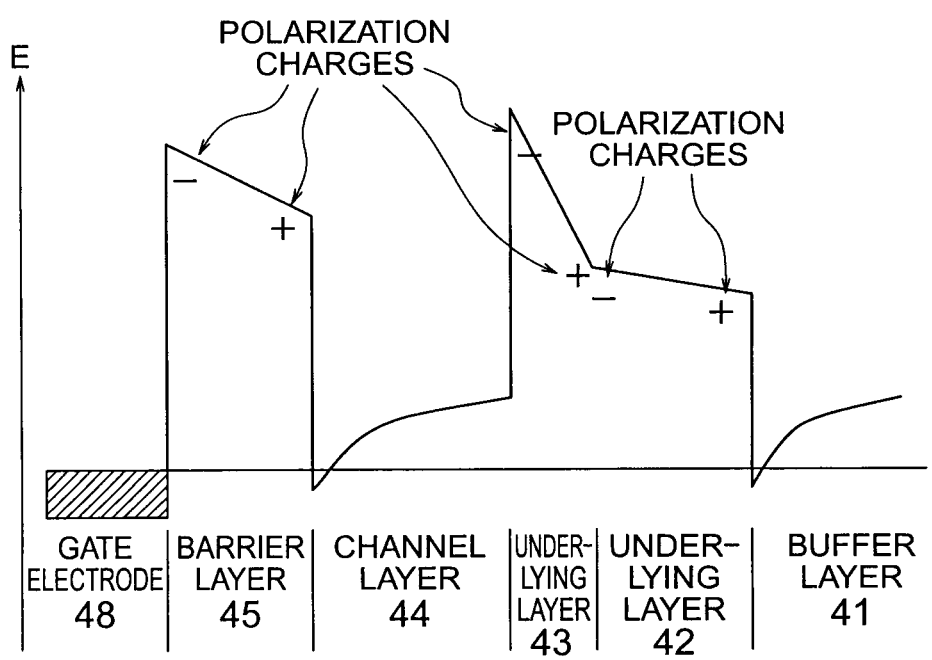
FIG. 24 is a schematic diagram showing energy of a conduction band.

In the nitride semiconductor device according to the present embodiment shown in FIG. 19 as well, carriers of the two-dimensional electron system are formed at the interface between the buffer layer 41 and the first underlying layer 42 as shown in FIG. 24 and the pinch-off characteristics are degraded, when large negative polarization is generated in the first underlying layer 42 on the substrate surface side and large positive polarization is generated on the buffer layer 41 side. Therefore, it is necessary to prevent large negative polarization from being generated in the first underlying layer 42 on the substrate surface side and large positive polarization from being generated on the buffer layer 41 side. If the In composition ratio T is at least approximately 0.3 in the first underlying layer 42 formed of an $(In_TAl_{1-T})_SGa_{1-S}N$ film, large negative polarization is not generated in the first underlying layer 42 on the substrate surface side and large positive polarization is not generated on the buffer layer 41 side as shown in FIG. 22. In the nitride semiconductor device according to the present embodiment shown in FIG. 19, degradation of the pinch-off characteristics can be prevented.

Figure 25:
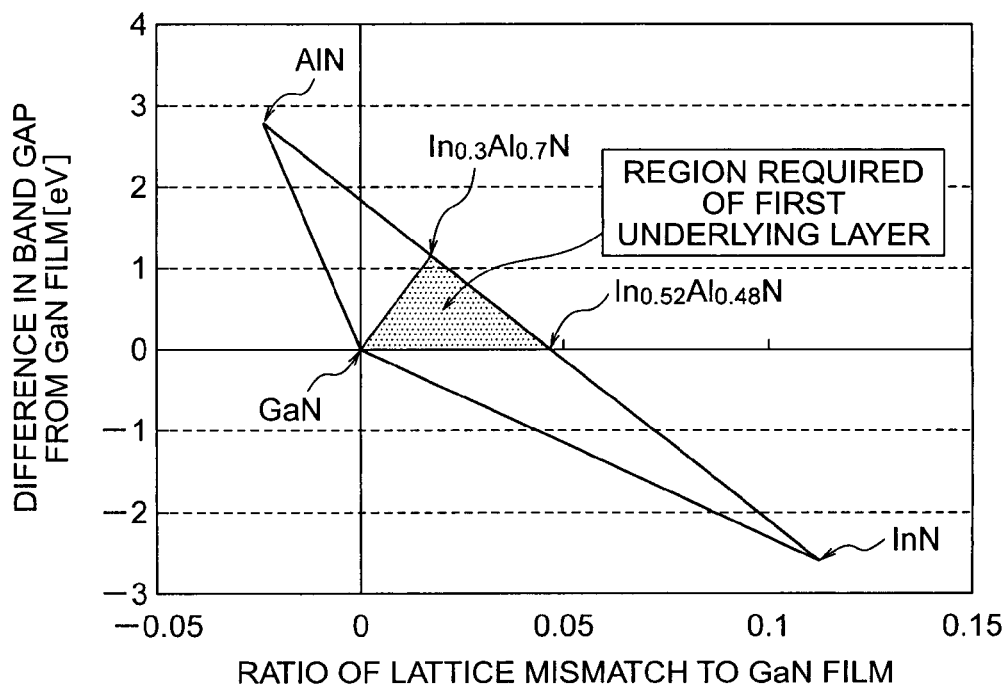
FIG. 25 is a diagram showing a region required of a first underlying layer.

If the In composition ratio T in the first underlying layer 42 is at least approximately 0.52, the band gap is greater than the buffer layer 41 formed of the GaN film and the influence of carriers remaining in the buffer layer 41 can be prevented as shown in FIG. 25. In the nitride semiconductor device according to the present embodiment shown in FIG. 19, therefore, the pinch-off characteristics can be improved.

The degree of lattice mismatching to the buffer layer 41 formed of the GaN film and the band gap can be changed by changing the composition ratio (1-S) of Ga in the first underlying layer 42, as shown in FIG. 25. If the composition ratio of Ga is made large, the lattice mismatch to the buffer layer 41 formed of the GaN film (value of the abscissa axis shown in FIG. 25) becomes small and the first underlying layer 42 can be formed with a good film quality. If the Ga composition ratio is made small, the band gap difference from the buffer layer 41 can be made large and consequently the influence of carriers remaining in the buffer layer 41 can be excluded efficiently. If the In composition ratio T is thus in the range $0.3 \leq T \leq 0.52$, the Ga composition ratio can be freely changed according to characteristics required of the semiconductor device.

Figure 26:
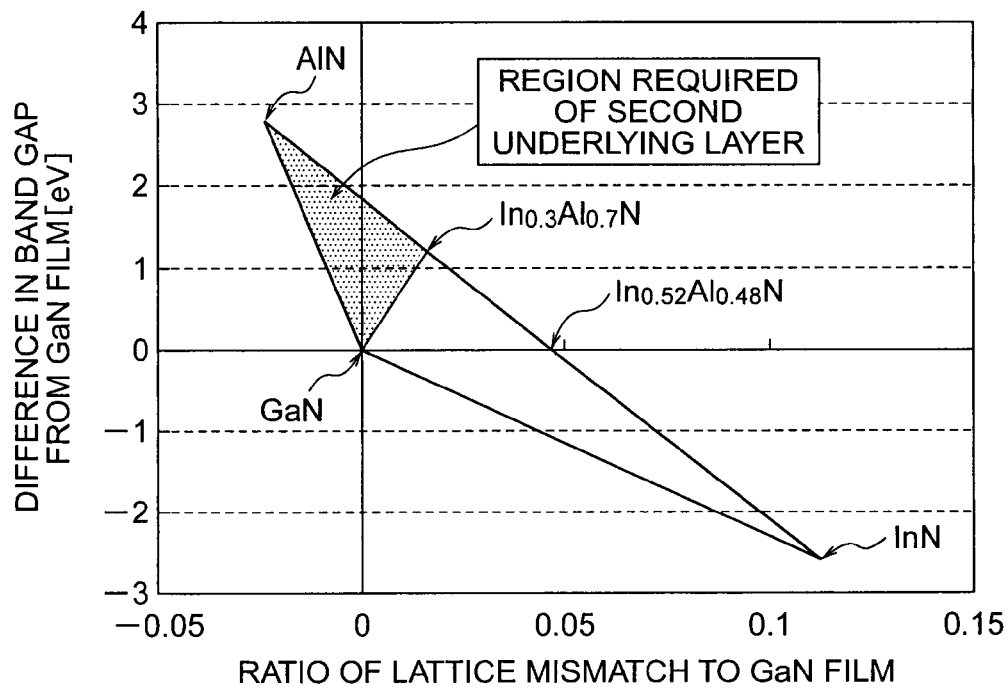
FIG. 26 is a diagram showing a region required of a second underlying layer.

For raising the conduction band energy in the channel layer 44 and improving the pinch-off characteristics, it is necessary to generate negative polarization charges on the channel layer 44 side in the second underlying layer 43 as shown in FIG. 20. Since the In composition ratio Y in the second underlying layer 43 formed of an $(In_YAl_{1-Y})_XGa_{1-X}N$ ($0<X \leq 1$, $0 \leq Y<1$) film is 0.3 or less, negative polarization charges can be generated on the channel layer 44 side in the second underlying layer 43 because of dependence of the polarization charge density upon the composition ratio shown in FIG. 22. Therefore, it becomes possible to form a nitride semiconductor device which is excellent in pinch-off characteristics. If at this time the first underlying layer 42 is formed of an $(In_TAl_{1-T})_SGa_{1-S}N$ ($0<S \leq 1$, $0<T \leq 1$) film, it is desirable that T>Y. In the same way as the first underlying layer 42, the Ga composition ratio can be freely changed according to characteristics required of the semiconductor device as shown in FIG. 26.

If the lattice constant in the second underlying layer 43 in a direction perpendicular to the stacking direction from that of the GaN film of the buffer layer 41, strain is caused so as to make the lattice constant the same as that of the buffer layer 41. If the buffer layer 41 is formed of the GaN film and a film having the same lattice constant as that of the GaN film is used as the second underlying layer 43, it becomes possible to form a high quality film in which strain is not caused and cracks and dislocation densities are few. The condition under which the second underlying layer 43 is in lattice matching to the buffer layer 41 is Y=0.17. Therefore, it becomes possible to form the layer structure with high quality by using an $(In_{0.17}A_{0.83})_XGa_{1-X}N$ ($0<X \leq 1$) film as the second underlying layer 42. As a result, it becomes possible to form a nitride semiconductor device having few traps.

Figure 27:
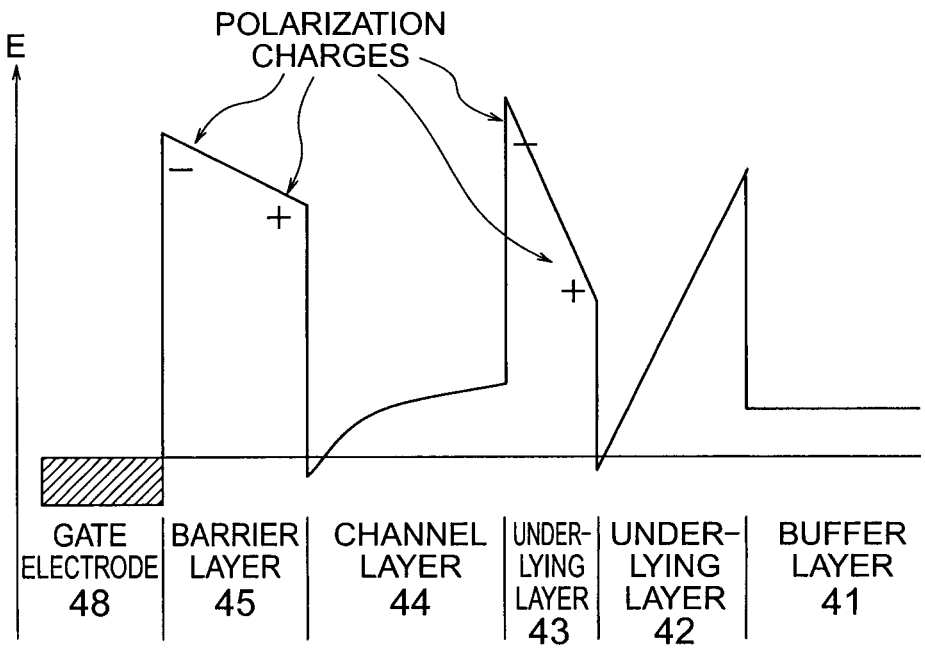
FIG. 27 is a schematic diagram showing energy of a conduction band.

If the second underlying layer 43 is greater in band gap than the first underlying layer 42, a difference is caused in conduction band energy at the interface between the second underlying layer 43 and the first underlying layer 42 according to the difference in band gap as shown in FIG. 27. Therefore, carriers of the two-dimensional electron system can be formed at the interface between the second underlying layer 43 and the first underlying layer 42. In the nitride semiconductor device according to the present embodiment shown in FIG. 19, therefore, the pinch-off characteristics are degraded. It becomes possible to form a nitride semiconductor device in which residual carriers are few at the interface between the second underlying layer 43 and the first underlying layer 42 and the pinch-off characteristics are excellent by making the band gap in the second underlying layer 43 nearly the same as that in the first underlying layer 42 or making the band gap in the second underlying layer 43 smaller than that in the first underlying layer 42.

In the present embodiment, the GaN film is used as the channel layer 44 and the AlGaN film is used as the barrier layer 45. Alternatively, it is possible to use an $In_PGa_QN$ film ($0<P<1$, $0<Q<1$) as the channel layer 44 and use an $In_UAl_VGa_WN$ film ($0 \leq U<1$, $0 \leq V<1$, $0<W \leq 1$, U+V+W=1) as the barrier layer 45. In this case, it is desirable that the In composition ratio U of the barrier layer 45 is 0.3 or less so as to have no difference in lattice constant from the buffer layer 41 and the Al composition ratio W is in the range of 0.1 to 0.4.

(First and Second Modifications)

Figure 28:
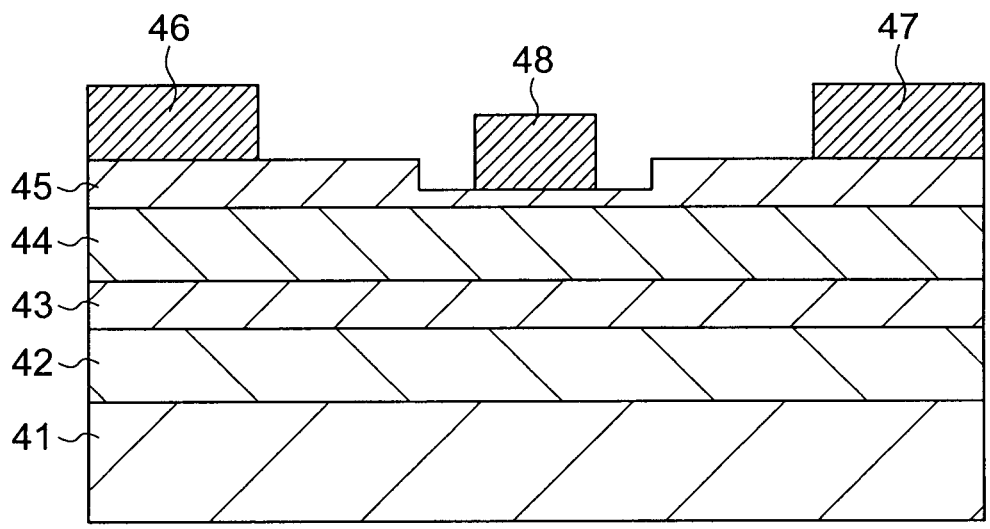
FIGS. 28 and 29 are sectional views showing a nitride semiconductor device according to a modification of the fourth embodiment.
Figure 29:
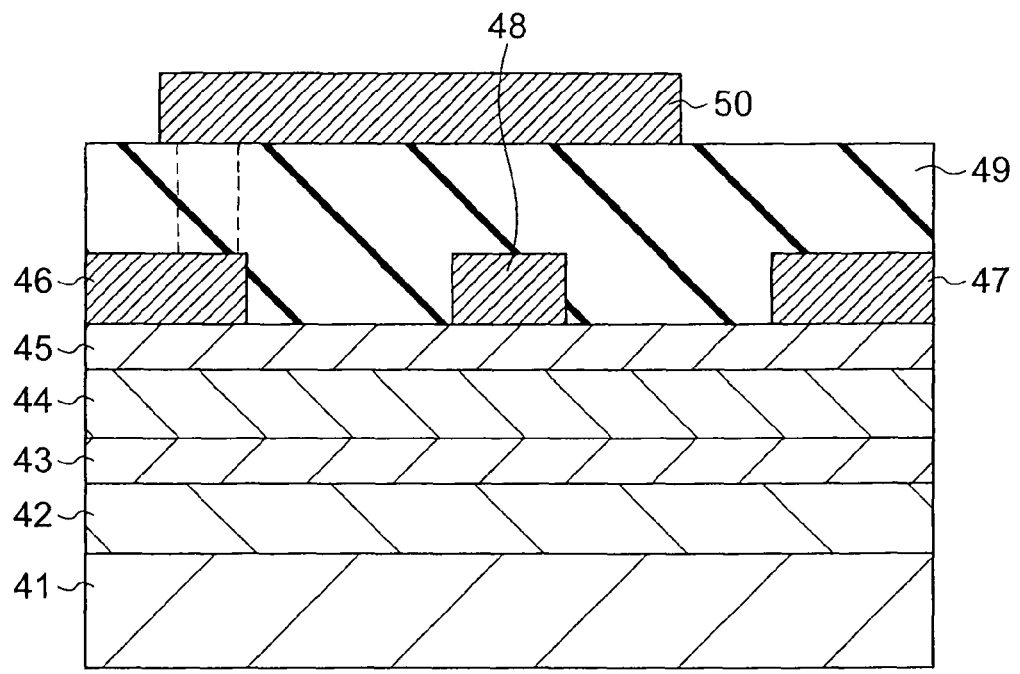

A nitride semiconductor device according to a first modification of the fourth embodiment is shown in FIG. 28, and a nitride semiconductor device according to a second modification of the fourth embodiment is shown in FIG. 29. The nitride semiconductor device according to the first modification shown in FIG. 28 differs from that according to the fourth embodiment shown in FIG. 19 in that a recess structure is formed by removing a part of the barrier layer 45 and a gate electrode 48 is formed in the recess structure. The nitride semiconductor device according to the second modification shown in FIG. 29 differs from that according to the fourth embodiment shown in FIG. 19 in that an insulation film 49 is formed on the barrier layer 45 and a field plate electrode 50 is formed on the insulation film 49. In the nitride semiconductor devices according to the first and second modifications as well, the effect of the favorable pinch-off characteristics is obtained if the first underlying layer 42 and the second underlying layer 43 are formed as described above. In the fourth embodiment and its modifications, therefore, the structure above the barrier layer 45 can be designed freely.

Figure 31:
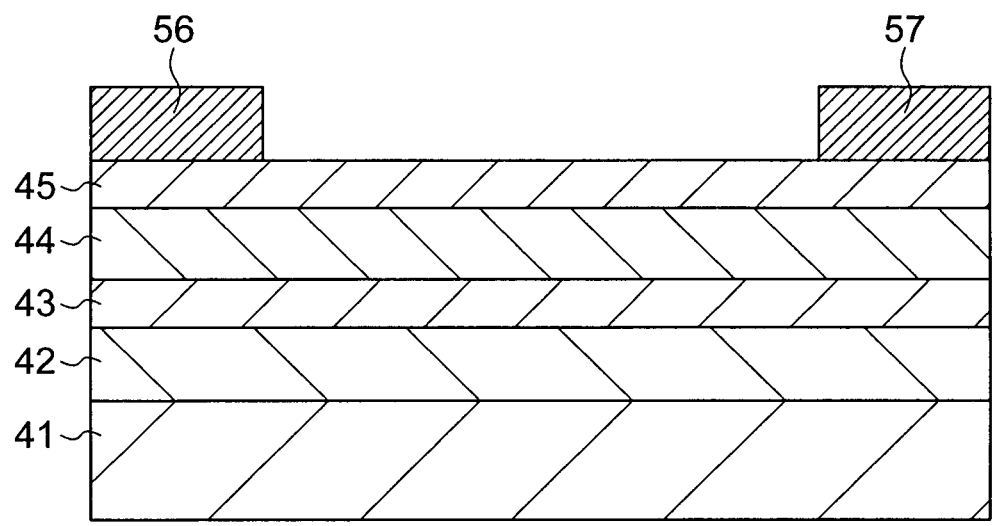
FIG. 31 is a sectional view showing a diode according to a modification of the fourth embodiment.

The foregoing description mainly concerns a transistor having three electrodes on the barrier layer 45. However, it is evident that similar effects can be obtained even for, for example, a diode having two electrodes on the barrier layer 45. For example, as shown in FIG. 31, the diode has a configuration obtained from that in the fourth embodiment shown in FIG. 19 by providing an anode electrode 56 and a cathode electrode 57 instead of the source electrode 46, the drain electrode 47 and the gate electrode 48.

Fifth Embodiment

Figure 30:
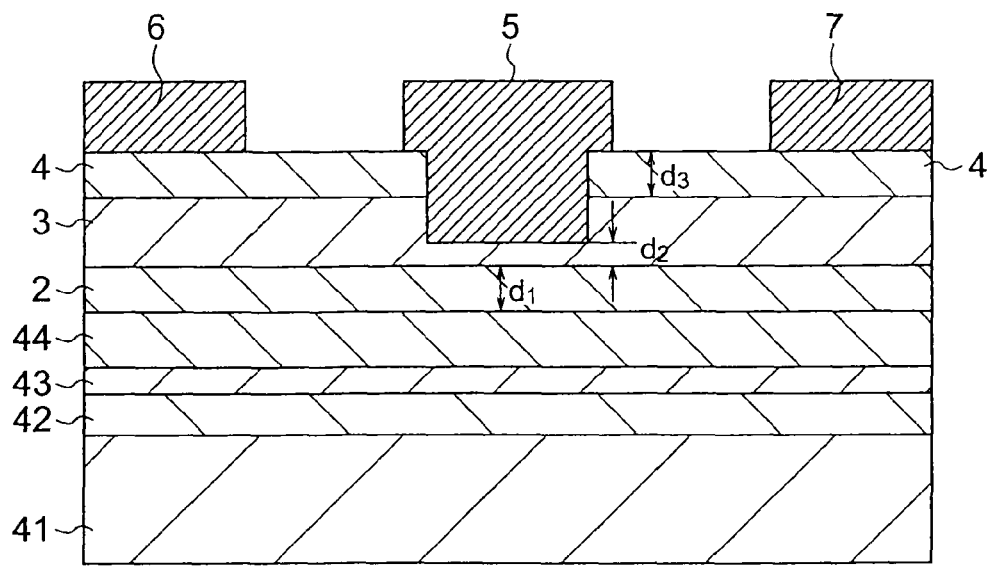
FIG. 30 is a sectional view showing a nitride semiconductor device according to a fifth embodiment.

A nitride semiconductor device according to a fifth embodiment of the present invention is shown in FIG. 30. The nitride semiconductor device according to the present embodiment has a configuration obtained from the nitride semiconductor device according to the first embodiment shown in FIG. 1 by replacing the carrier transit layer 1 with the buffer layer 41, the first underlying layer 42, the second underlying layer 43 and the channel layer 44 in the nitride semiconductor device according to the fourth embodiment shown in FIG. 19. Viewing from the nitride semiconductor device according to the fourth embodiment shown in FIG. 19, the nitride semiconductor device according to the present embodiment has a configuration obtained by replacing the barrier layer 45 with a laminated film composed of the barrier layer 2, the threshold control layer 3 and the carrier induction layer 4 in the nitride semiconductor device according to the first embodiment shown in FIG. 1.

Owing to such a configuration, the nitride semiconductor device according to the present embodiment can have both advantages of the first embodiment and the fourth embodiment. In other words, a nitride semiconductor device in which the threshold voltage can be controlled easily and the on-resistance is low can be provided with a high yield. In addition, a normally-off type nitride semiconductor device having low on-resistance can be provided with a high yield.

By the way, the nitride semiconductor layer according to the present embodiment can be combined with the first to third modifications of the first embodiment, the second embodiment, the third embodiment and its modification, or the first and second modifications of the fourth embodiment. Moreover, a nitride semiconductor device having favorable pinch-off characteristics can be provided.

According to the embodiments of the present invention, a nitride semiconductor device in which the threshold voltage can be controlled easily and the on-resistance is low can be provided with a high yield. Furthermore, according to an embodiment of the present invention, a nitride semiconductor device having favorable pinch-off characteristics can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A nitride semiconductor device comprising:
    a first nitride semiconductor layer formed of non-doped $Al_XGa_{1-X}N$ ($0 \leq X \leq 1$);
    a second nitride semiconductor layer in direct contact with and directly adjacent the first nitride semiconductor layer of non-doped or n-type $Al_YGa_{1-Y}N$ ($0 \leq Y \leq 1, X<Y$), and having a smaller lattice constant than that of the first nitride semiconductor layer;
    a third nitride semiconductor layer in direct contact with and directly adjacent the second nitride semiconductor layer of a non-doped or n-type nitride semiconductor, the third nitride semiconductor layer being a single layer and having a lattice constant equal to that of the first nitride semiconductor layer;
    a fourth nitride semiconductor layer in direct contact with and directly adjacent the third nitride semiconductor layer of $In_WAl_ZGa_{1-W-Z}N$ ($0<W<1, 0<Z<1, 0<W+Z<1$) and having a smaller lattice constant than that of the third nitride semiconductor layer;
    a gate electrode formed in a recess structure that passes through the fourth nitride semiconductor layer and that has a bottom face located in the third nitride semiconductor layer such that a thickness of the third nitride semiconductor layer remains under the gate electrode;
    a source electrode and a drain electrode formed on the second nitride semiconductor layer, the third nitride semiconductor layer, or the fourth nitride semiconductor layer so as to sandwich the gate electrode therebetween, and
    wherein a polarization charge on the surface of the third nitride layer facing the second nitride layer is negative and a polarization charge on the surface of the third nitride layer in contact with the fourth nitride layer is positive.

2. The device according to claim 1, wherein the second nitride semiconductor layer has a film thickness $T_2$ satisfying a following inequality $$T_2 \leq 16.4 \times (1-1.27\times(Y-X))/(Y-X) [\text{Å}],$$

where (Y−X) is less than 1/1.27.

3. The device according to claim 1, further comprising:
    an insulation film formed so as to cover the gate electrode, the source electrode and the drain electrode; and
    a field plate electrode connected to the gate electrode or the source electrode, at least one end of the field plate electrode being located on the insulation film between an end of the gate electrode on the drain electrode side and the drain electrode.

4. The device of claim 3, wherein the field plate electrode is connected to the gate electrode.

5. The device of claim 3, wherein the field plate electrode is connected to the source electrode.

6. The device according to claim 1, wherein the fourth nitride semiconductor layer has a film thickness in the range of 1 nm to 10 nm.

7. The device of claim 1, wherein the second nitride semiconductor layer is formed of non-doped $Al_YGa_{1-Y}N$ ($0<Y \leq 1, X<Y$).

8. The device of claim 1, wherein the second nitride semiconductor layer is formed of n-type $Al_YGa_{1-Y}N$ ($0<Y \leq 1, X<Y$).

* * * * *